(12) United States Patent  
Wadland et al.

(10) Patent No.: US 8,549,459 B1
(45) Date of Patent: *Oct. 1, 2013

(54) SYSTEMS FOR AUTOMATIC CIRCUIT ROUTING WITH OBJECT ORIENTED CONSTRAINTS

(75) Inventors: Ken Wadland, Grafton, MA (US); Sean Bergan, Andover, MA (US); Charles W. Grant, Leominster, MA (US); Glendine Kingsbury, Acton, MA (US); Randall Lawson, Westford, MA (US); Jelena Radumilo-Franklin, Westford, MA (US); Kota Sujan Reddy, Worcester, MA (US); Steve Russo, Holden, MA (US); William Schilp, Groton, MA (US); Davis Tsai, Windham, NH (US); Keith Woodward, San Diego, CA (US); Richard Woodward, San Diego, CA (US); Jia Wu, San Diego, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 12/834,972

(22) Filed: Jul. 13, 2010

Related U.S. Application Data

(63) Continuation of application No. 11/548,288, filed on Oct. 11, 2006, now Pat. No. 7,761,836.

(51) Int. Cl.
*G06F 17/50* (2006.01)
*G06F 9/44* (2006.01)

(52) U.S. Cl.
USPC ........... 716/126; 716/100; 716/101; 716/103; 716/129; 716/130; 717/108; 717/165

(58) Field of Classification Search
USPC ................. 716/100–101, 103, 126, 129–130; 717/108, 165; 71/108, 165
See application file for complete search history.

(56) References Cited

U.S. PATENT DOCUMENTS

| | | | |
|---|---|---|---|
| 6,507,941 B1 | 1/2003 | Leung et al. | |
| 6,516,447 B2 | 2/2003 | Wadland et al. | |
| 7,065,729 B1 * | 6/2006 | Chapman | 716/129 |
| 7,370,309 B2 * | 5/2008 | Tetelbaum | 716/130 |
| 7,464,358 B1 | 12/2008 | Wadland et al. | |
| 7,506,289 B1 * | 3/2009 | Chapman | 716/126 |
| 7,536,665 B1 | 5/2009 | Wadland et al. | |
| 7,761,836 B1 * | 7/2010 | Wadland et al. | 716/130 |

(Continued)

OTHER PUBLICATIONS

Gamma, E. Helm, R. Johnson, R. Vlissides, J., Design Patterns Elements of Reusable Object-Oriented Software, 1995, 107-116,223-232, 325-330. Addison-Wesley.

(Continued)

*Primary Examiner* — Stacy Whitmore
(74) *Attorney, Agent, or Firm* — Alford Law Group, Inc.

(57) ABSTRACT

In one embodiment of the invention, an object oriented autorouter is disclosed for routing nets in a circuit. The object oriented autorouter includes a routing data model (RDM); at least one routing engine, such as a single connection router (SCR), a topographical (TOPO) transformation engine, and a detail geometric (DETAIL) engine, and a command and control module (CCM) coupled together. The RDM reads and write data with a design database as well as reading one or more object oriented design constraints. Each of the routing engines have at least one action to operate on the design database to improve compliance of the circuit to a constraint. The CCM controls the overall routing process of the nets in the circuit and includes at least one director to invoke at least one of the routing engines to achieve compliance with one or more constraints.

15 Claims, 24 Drawing Sheets

(56) References Cited

U.S. PATENT DOCUMENTS

| | | | |
|---|---|---|---|
| 2003/0046422 | A1 | 3/2003 | Narayanan et al. |
| 2004/0044979 | A1 | 3/2004 | Aji et al. |
| 2006/0095882 | A1 | 5/2006 | Mankin et al. |
| 2006/0242614 | A1 | 10/2006 | Wadland et al. |
| 2007/0033551 | A1 | 2/2007 | Greaves et al. |
| 2007/0079274 | A1* | 4/2007 | Tetelbaum .................. 716/12 |
| 2008/0028352 | A1 | 1/2008 | Birch et al. |
| 2008/0077901 | A1 | 3/2008 | Arsintescu |
| 2008/0256517 | A1 | 10/2008 | Atkin et al. |

OTHER PUBLICATIONS

MacLennan, B; Holt, Rinehart, and Winston. Principles of Programming Languages: Design, Evaluation, and Implementation. 1983 CBS College Publishing. pp. 453-498.

Gamma, E. Helm, R. Johnson, R. Vlissides, J., Design Patterns Elements of Reusable Object-Oriented Software, 1995, pp. 87-96. Addison-Wesley.

U.S. Appl. No. 11/098,039, Methods and Mechanism for Implementing PCB Routing by Ken Wadland et al, filed United States Patent Office on Apr. 1, 2005, 32 total pages.

Masson, Christian, et al., "Object oriented lisp implementation of the CHEOPS VLSI floor planning and routing system", 1991. ACM, 28th ACM/IEEE Design Automation Conference. pp. 259-264.

Whitmore, Stacy, Oct. 24, 2008 Office Action U.S. Appl. No. 11/548,288, 8 pages.

Whitmore, Stacy, Jun. 29, 2009 Office Action U.S. Appl. No. 11/548,288, 12 pages.

* cited by examiner (Background)

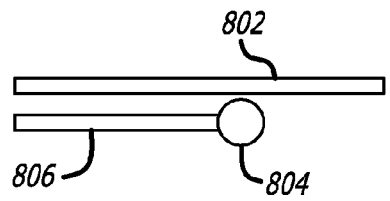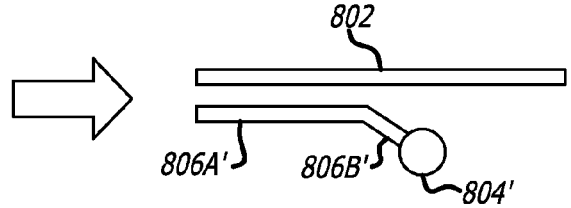
FIG. 8A    FIG. 8B
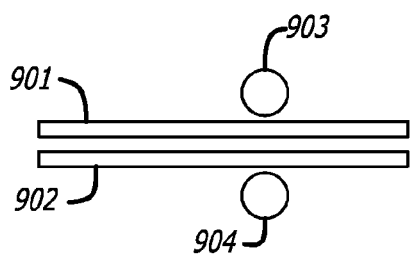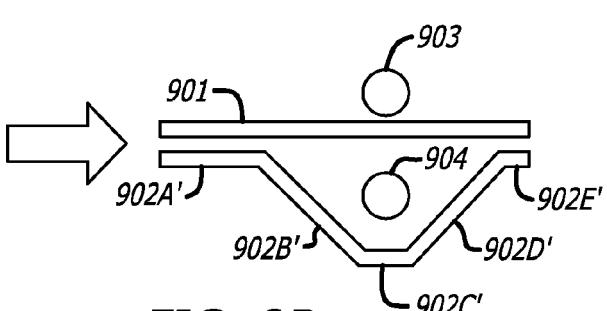
FIG. 9A    FIG. 9B
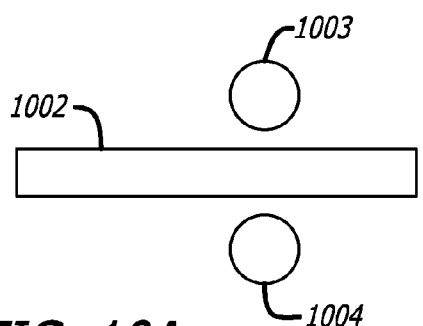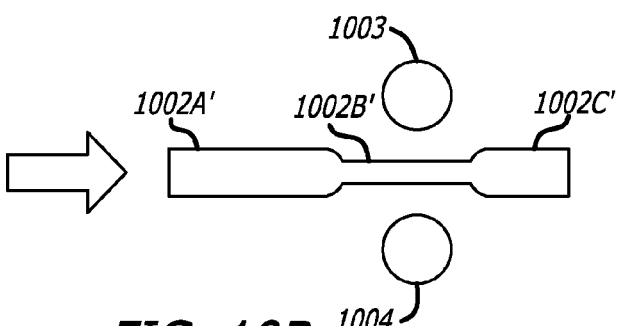
FIG. 10A    FIG. 10B DETAIL Separation of Concerns

| Mid-Level Objective | Low-Level Action | State Representation |
|---|---|---|
| Create Wires | Jump | Wire |
| Clean | Shove | |
| | Reflect | PushState |
| DETAIL Constraint Handlers | | |

TOPO Separation of Concerns

| Mid-Level Objective | Low-Level Action | State Representation |
|---|---|---|
| Resolve Terminal Overload | Jump | Joint |
| Resolve CutPortal Overload | Shove Joint | Strut |
| TOPO Constraint Handlers | Unwind | Context |

SCR Separation of Concerns

| Mid-Level Objective | Low-Level Action | State Representation |
|---|---|---|
| SCR Pass | Expand to CutPortal | Probe |
| SCR CNS Handlers | Expand to Via | Breadcrumb |
|  | Walkback | Wavefront |

| Hierarchy | Class Name | Header File Name | Location |
|---|---|---|---|
| Definition | BaseCns | rdm_basecns.h | Global include |
| Status | CnsStatus | rdm_cnsstatus.h | Global include |
| SCR Handler | ScrHandler | rdm_scrhandler.h | Global include |
| Topo Handler | TopoHandler | rdm_topohandler.h | Global include |
| Detail Handler | DetailHandler | rdm_detailhandler.h | Global include |

FIG. 29A

| Hierarchy | Class Name | Source File Name | Location |
|---|---|---|---|
| Definition | BaseCns | cns.cxx | CNS Tier of RDM |
| Status | CnsStatus | cnsstatus.cxx | CNS Tier of RDM |
| SCR Handler | ScrHandler | cnshandler.cxx | CNS Tier of RDM |
| Topo Handler | TopoHandler | cnstopo.cxx | TOPO source |
| Detail Handler | DetailHandler | cnsdetail.cxx | Detail source |

FIG. 29B

| Hierarchy | Class Name | Header File Name | Location |
|---|---|---|---|
| Definition | NetMaxViaCns | netmaxviacns.h | CNS local includes |
| Status | NetMaxViaCnsStatus | netmaxviacnsstatus.h | CNS local includes |
| SCR Handler | ViaScrHandler | viascrhandler.cxx | SCR local source |
| Topo Handler | ViaTopoHandler | viatopohandler.cxx | Topo local source |
| Detail Handler | ViaDetailHandler | viadetailhandler.cxx | Detail local source |

FIG. 29C

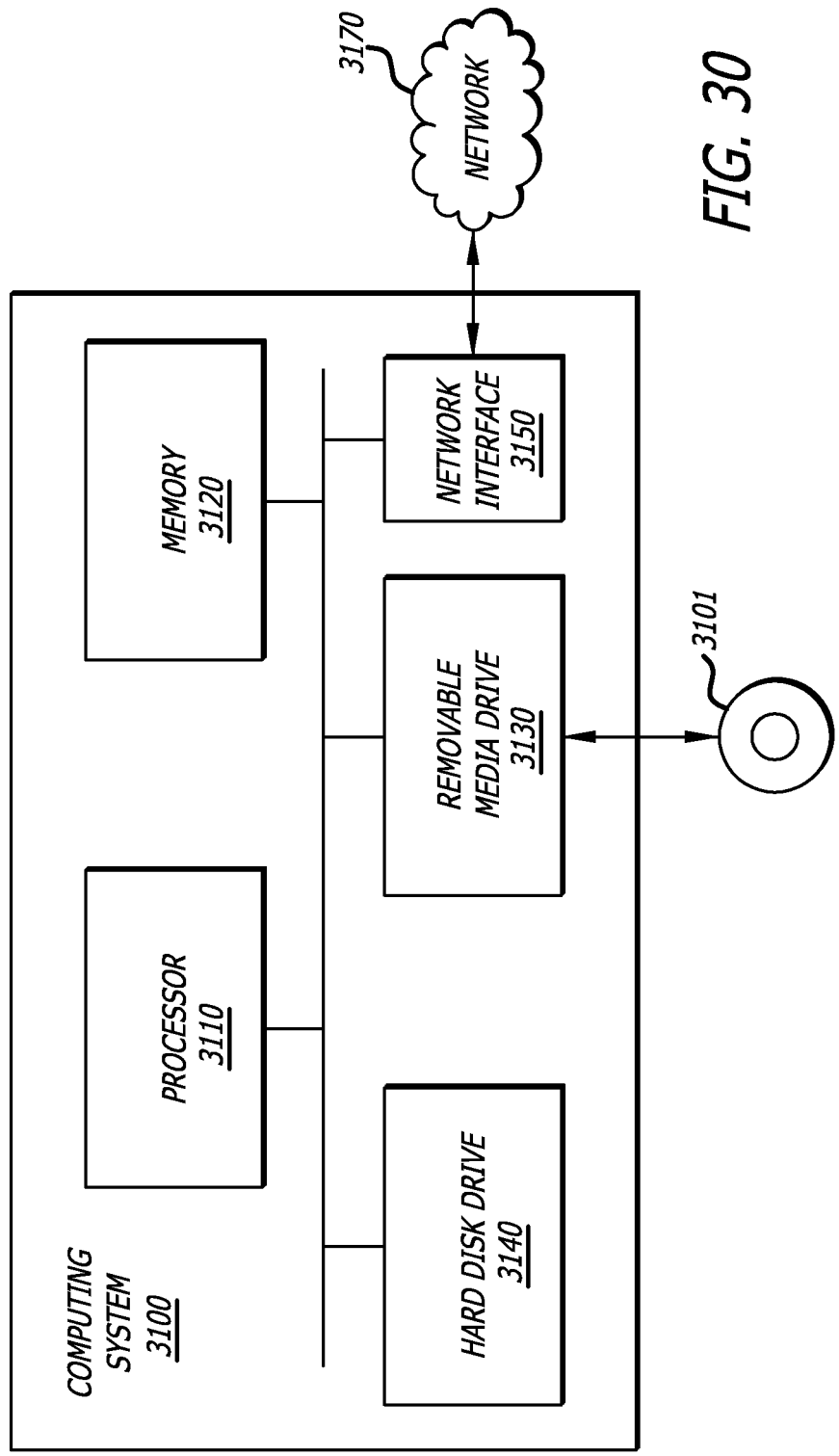

SYSTEMS FOR AUTOMATIC CIRCUIT ROUTING WITH OBJECT ORIENTED CONSTRAINTS

CROSS REFERENCE

This non-provisional United States (U.S.) patent application is a continuation application and claims the benefit of U.S. patent application Ser. No. 11/548,288 entitled CIRCUIT AUTOROUTER WITH OBJECT ORIENTED CONSTRAINTS filed on Nov. 11, 2006 by inventors Ken Wadland et al., now allowed.

FIELD

The embodiments of the invention relate generally to physical layout tools for printed circuit boards and integrated circuits. More particularly, the embodiments of the invention relate to placement and routing tools for printed circuit boards and integrated circuits.

BACKGROUND

An autorouter is a collection of algorithms that attempt to find a set of wire segments (line segments on a routing layer, also referred to as "nets") and a set of vias (connections between routing layers) that connect terminals (component pins) while at the same time satisfying a set of known design constraints, such as design rules. To do so, they make an enormous number of tiny decisions. Typically these decisions made by the algorithms in a typical autorouter are based on numerically computed "costs". That is when faced with alternate choices, the algorithms select the lower cost alternative.

Early in the history of the electronic design automation (EDA) industry, circuit designs had only physical constraints to meet. For example, consider the design rule of maintaining a minimum clearance between two routing segments for different nets. In this environment, the "cost" was the length of the routing segments. A shorter length meant less space used resulting in lower costs and hence, a greater likelihood of finding a complete solution.

As clock speeds increased, timing constraints were introduced such as "maximum delay" constraints. That is, not only did the autorouter need to minimize the total length of a wire segment but it had to do so in a way that didn't exceed the maximum delay rules for these nets. The added complexity of having to meet timing constraints was solved by algorithms that either first routed the delay-constrained nets or changed the cost function so that the length for these delay-constrained nets had a higher cost so that they would have a greater priority in routing over other nets with lower costs.

As clock frequencies continued to increase further still, additional design constraints were added to routing a circuit layout. Algorithms were provided in autorouters to try to further adapt by either routing the additional constrained nets first or by further tuning cost functions.

However, using these two approaches to meet additional design constraints for routing a circuit design are reaching their limits and can no longer be extended. For example, in today's high-end printed circuit board designs it may be impossible to route the constrained nets first because almost every net now has a design constraint to meet. In fact, many nets have multiple design constraints to meet. The multiple design constraints when attempting to route a net may interact and make it difficult, if not impossible, to further tune the cost functions as the different constraints for a net cannot be expressed as a single numeric value. Furthermore with numerous constraints for routing a design, it is common for the constraints to conflict.

Referring now to background FIG. 1, an exemplary portion of a circuit layout 100 is illustrated to explain how multiple design constraints may conflict. The circuit layout 100 has a pair of top pins 109, 110 and a bottom pin 111. Nets or wire segments 104-108 route between the pair of top pins 109, 110 and the bottom pin 111.

A first exemplary design constrain 121, a maximum crosstalk constraint, requires that the two nets 105,106 be spaced further apart by a spacing 140 than minimum spacing so that signals on each are not distorted. For comparison, minimum spacing may be illustrated by the spacing 145 between nets 104,105.

A second exemplary design constraint 122, a minimum delay constraint, requires that the net 107 use a serpentine path so that the signals thereon do not arrive too early. This constraint may require significant area to route the net 107 in comparison with the net 108 as illustrated.

A third exemplary design constraint 123, a pin entry constraint, requires that a track segment 133 can only enter pin 111 from the narrow end 141 in contrast to the long end 142 as shown in order to reduce manufacturing yield problems.

These constraints are further constrained by the positioning of the pair of top pins 109, 110 and the bottom pin 111 and the limited amount of space between them.

It is difficult, if not impossible, to concurrently satisfy all of these constraints when routing. Clearly there is a pad exit problem at the bottom pin 111, particularly if pad 111 is fixed in position and the spacing 150 between net 108 and track segment 133 is already at a minimum spacing.

Thus, there is a need for a new approach to represent and process multiple design constraints in an autorouter for routing nets of electronic circuit designs.

BRIEF SUMMARY

The embodiments of the invention are summarized by the claims that follow below.

BRIEF DESCRIPTIONS OF THE DRAWINGS

FIGS. 8A-8B illustrate an exemplary detail shove terminal action.

FIGS. 9A-9B illustrate an exemplary detail jump ratLine over terminal action.

FIGS. 10A-10B illustrate an exemplary detail neckdown ratline action.

FIG. 29A is a chart illustrating the file organization of the base classes for each of the constraint hierarchies.

FIG. 29B is a chart illustrating the file organization of the base class implementation files for each of the constraint hierarchies.

FIG. 29C is a chart illustrating the file organization of the concrete class definitions for each of the constraint hierarchies.

FIG. 30 illustrates an exemplary embodiment of a computing system usable with embodiments of the invention.

DETAILED DESCRIPTION

Figure 1:
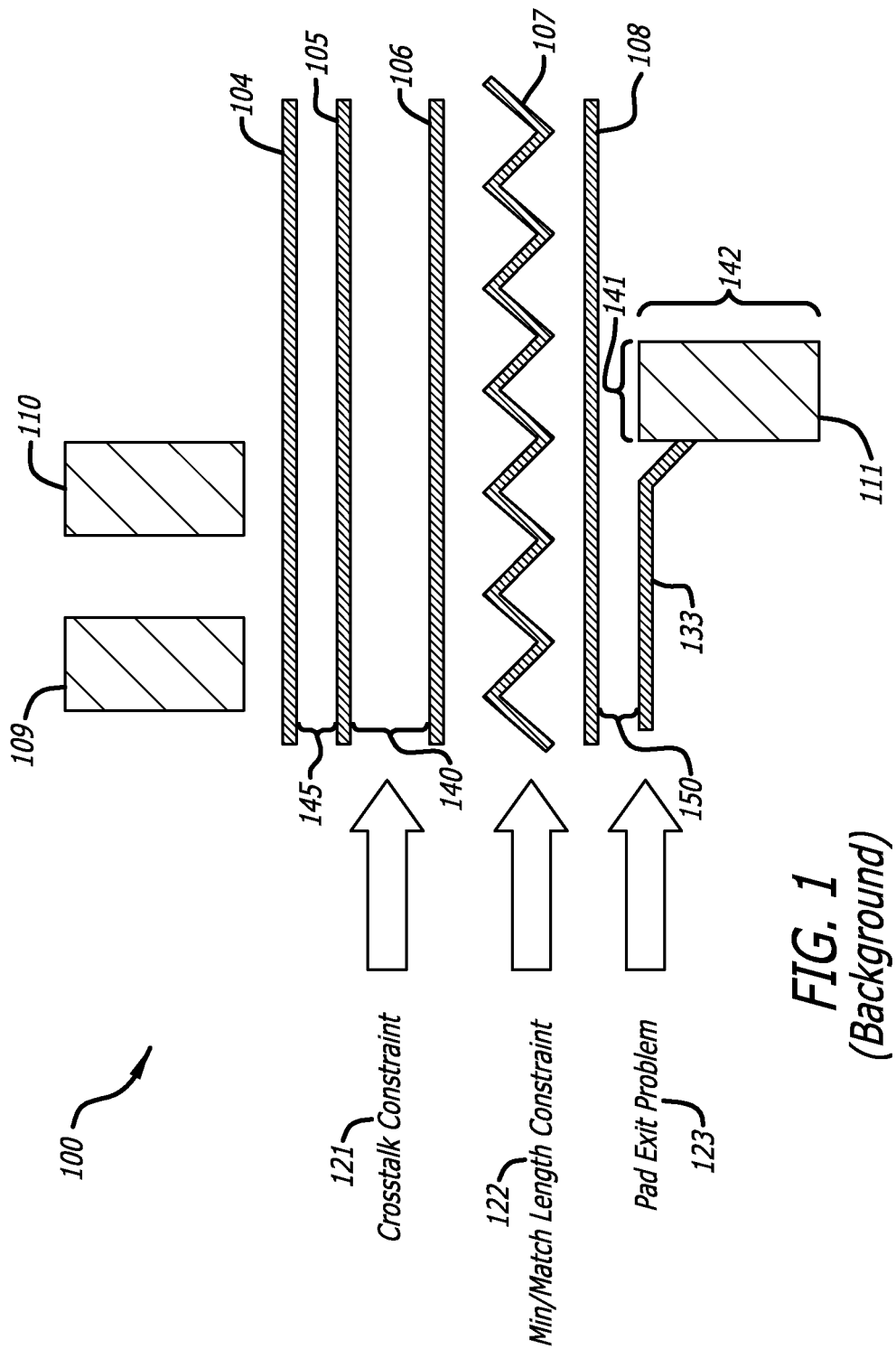
FIG. 1 is a background diagram illustrating constraints and problems encountered in routing nets on a printed circuit board.

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include methods, apparatus and systems for an object oriented circuit autorouter having object oriented constraints.

In one embodiment of the invention, an object oriented autorouter is provided for routing nets in a circuit. The object oriented autorouter includes a routing data model (RDM), a detail geometric routing engine coupled to the routing data model, and a command and control module (CCM) coupled to the detail geometric routing engine and the routing data model. The routing data model to read and write data with a design database, to read one or more object oriented design constraints, and to read and write one or more constraint status objects associated with the one or more object oriented design constraints. The detail geometric routing engine has at least one action to operate on the design database to improve compliance of the circuit to a constraint and further has at least one geometric detail handler for at least one constraint. The command and control module controls the overall routing process of the nets in a circuit and includes at least one director to invoke at least one routing engine to achieve compliance with one or more constraints.

In another embodiment of the invention, a method of routing nets in a circuit is provided. The method includes reading constraint definitions of a plurality of constraints to which the nets of the circuit are to comply; generating at least one constraint handler in response to the constraint definitions, at least one constraint handler to invoke an action associated with a routing engine; and performing the action to improve compliance of a net with the plurality of constraints.

In yet another embodiment of the invention another method of routing nets in a circuit is provided. The method includes providing a plurality of actions in at least one routing engine to route nets in a circuit; determining which ones of the plurality of actions to invoke to route the nets in the circuit in response to a plurality of objectives; and determining which of the plurality of objectives to apply to route the nets in the circuit in response to at least one design intent.

INTRODUCTION

The object oriented circuit autorouter of the present invention is a truly "constraint-driven" autorouter in contrast to other autorouters that may claim to be "constraint-driven" when in reality, they are "cost-driven" with the constraints contributing to those costs. The constraint handling architecture of the object oriented autorouter described herein provides a mechanism whereby the constraints are driving the decision making rather than being only contributors to decisions or, worse, being only post processing steps. Additionally, the embodiments of the object oriented autorouter do not rely on the order that nets are routed nor do they rely on being able to make design decisions based only on a single numeric computation.

The Constraint Handling architecture of the object oriented autorouter described herein allows the autorouter to resolve situations where different constraints have competing demands that are often contradictory. For example, the maximum length constraints on one net might conflict with the cross talk constraints on another net. Attempting to resolve either constraint might violate the other constraint. This architecture avoids the "ping pong" effect where the router keeps breaking one constraint while trying to resolve a different constraint.

The Constraint Handling architecture of the object oriented autorouter described herein also provides a mechanism for reducing the effort needed to introduce new constraint rules into the system. By moving decision making into the object oriented constraints themselves, specific constraints do not need to be fully aware of other constraints. Therefore, adding support for new constraints is significantly easier and less error prone.

By abstracting the constraints decisions directly in the main decision making processes, the resulting circuit autorouting system can concurrently handle large numbers of constraints as well as more complex constraints. By their very nature these decisions are "like comparing apples and oranges". The best solution is for the algorithms to deal with abstractions ("fruit") rather than the details ("apples and oranges").

Furthermore, by abstracting the constraint decisions and providing a mechanism driving decisions from within the constraint logic, it is possible, to enable user-defined constraints. Often, particularly for leading edge companies, design rules are considered proprietary advantages over their competitors. Although they want an autorouter to support their own design rules, they do not want this same support provided to their competitors. An Application Programming Interface (API) can be provided that is separated from the internal routing details. The API can be used by customers (or by a service bureau) to add support directly in the autorouter for proprietary constraints and design rules.

The routing algorithms of the object oriented autorouter may be categorized into three distinct categories: "Intents", "Objectives" and "Actions".

"Actions" are the "low-level" algorithms that implement routing functionality. One example of an action is: "Shove Via", which consists of the algorithms required to move a via from one location to another and to resolve any design rule violations that are caused by moving the via. Actions are normally recursive. That is, when performing an Action, it is often necessary to invoke another Action to correct problems caused by the first Action. This continues until no design rule violations exist or until all alternatives are exhausted.

An "Objective" is a "mid-level" algorithm that determines which Actions to invoke. For example, one Objective might be to find a path (of segments and vias) that connects the two Terminals of a particular Rat).

In the embodiments of the invention, an Objective can also be constraint related. For example, an Objective might be to reduce the crosstalk between a particular pair of Rats. These constraint-related Objectives can then be imbedded in the constraints themselves. That is, "Constraint Objects" define not only how to determine if the constraint is met but also how to invoke Objectives to transform the design so that it meets that constraint.

An "Intent" is a "high-level" algorithm that determines which Objectives to apply. For example, one Intent might be to find a global, topological solution that meets all of the electrical constraints but ignores some or all of the physical constraints. (This solution would typically have many physical design rule violations, such as crossed wires, but all of the electrical rules, such as maximum delays would be met.)

Another Intent might be to take a topologically completed design and transform it into a geometric design. This Intent might first apply the physical Objectives (creating geometric wires to implement the topological solution). Then, it would apply each of the electrical Objectives in some order.

Yet another Intent might be to automatically tighten or strengthen one or more design constraints. For example, after finding a complete geometric solution (one or more design constraints are all satisfied), it might be desirable to increase the physical clearance rules and reroute nets of a circuit to improve manufacturability. To do so, this Intent automatically would adjust one or more of the physical clearance rules and then apply its Objective to attempt to meet this new, more restrictive constraint. If no solution was found, it would return those constraints to their previous values. Conversely if one or more design constraints are not satisfied, a design intent may automatically relax one or more design constraints and apply its objective to find a geometric solution that meets the relaxed constraint to reroute nets of a circuit.

New Objectives can be added without any changes to the existing Actions and Intents provided that the core functionality needed by the Objectives is already provided by the Actions and the high-level functionality needed by the Objectives is already provided by the Intents.

Described herein is the architecture and logical flow of the object oriented circuit autorouter for recognizing and processing constraint information and for reconciling the diverse requirements of various electrical and physical constraints.

Objected Oriented Circuit Autorouter

Figure 2A:
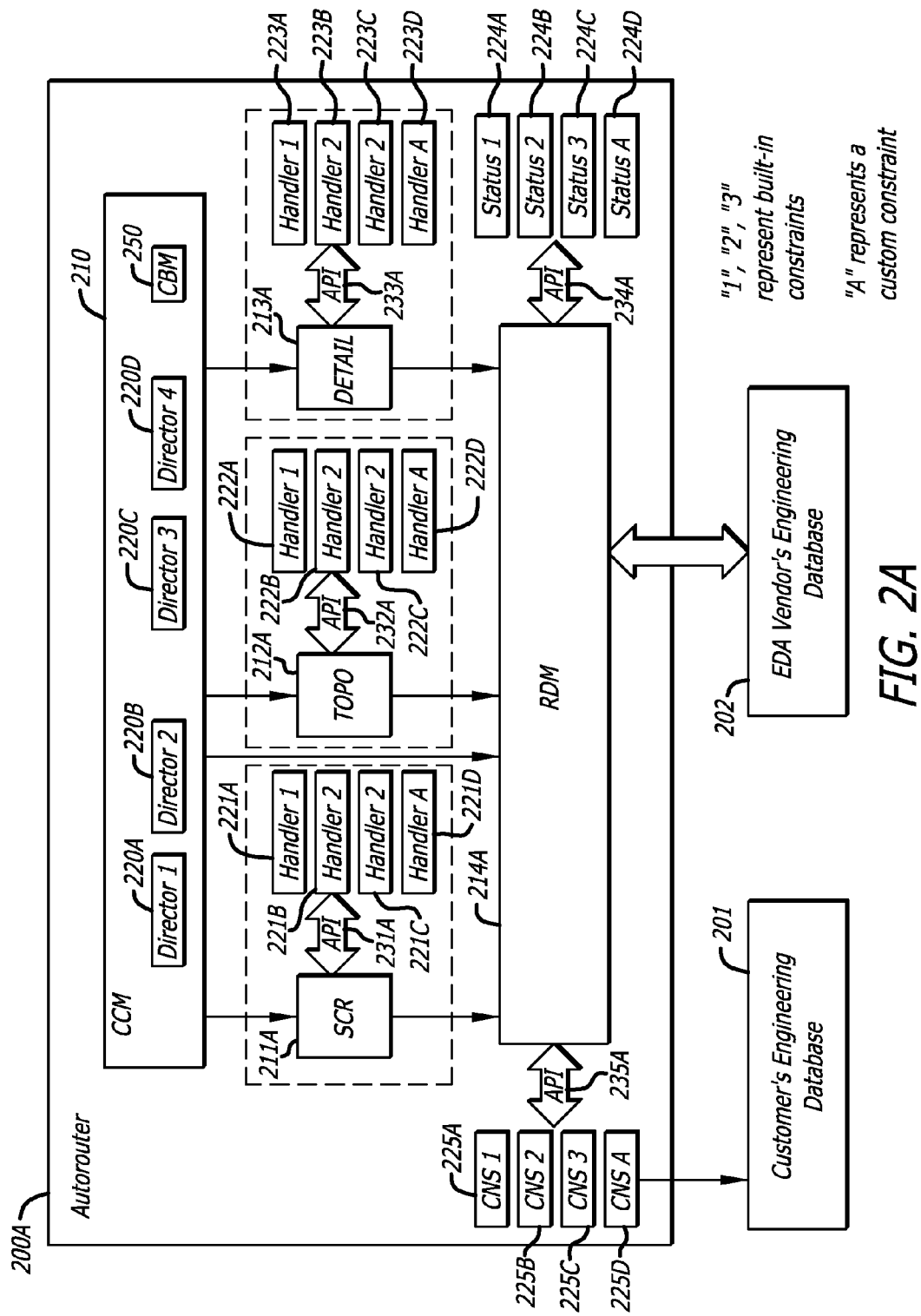
FIG. 2A is a functional block diagram of a first embodiment of an object oriented autorouter and system interface.
Figure 2B:
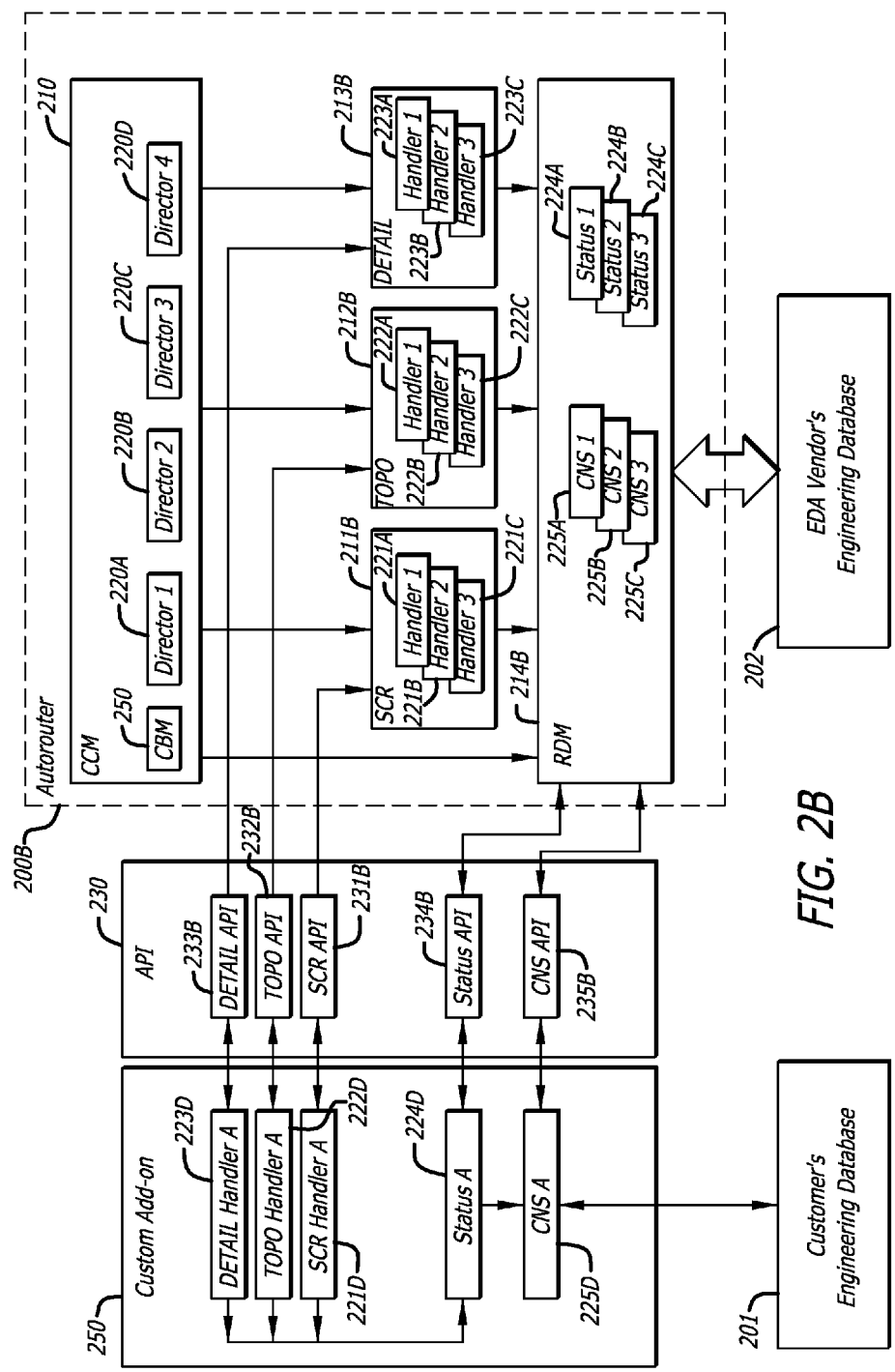
FIG. 2B is a functional block diagram of a second embodiment of an object oriented autorouter and system interface.

Referring now to FIGS. 2A-2B, an object oriented circuit autorouter 200A,200B (generally referenced by 200) has five main components, a top-level command-and-control module (CCM) 210; a single connection router (SCR) 211A-211B (generally referenced by 211); an optional topological transformation engine (TOPO) 212A-212B (generally referenced by 212); a detailed geometric engine (DETAIL) 213A,213B (generally referenced by 213); and a routing data model (RDM) 214A-214B (generally referenced by 214). These five components are structured like a layered cake. That is, at each given layer components can only be accessed in lower layers. The top layer, the CCM 210, can access all other components below it including the SCR, TOPO and DETAIL modules. The middle layer of functional modules, (the SCR, the TOPO and the DETAIL routing engines), can only access the RDM 214A,214B functional module and not each other. The bottom layer of functional modules, the RDM, cannot access any other component or functional module. However, the RDM 214A-214B can be accessed by any other component or functional module, including the CCM, SCR, TOPO and DETAIL routing engine functional modules.

The CCM 210 is responsible for controlling or managing the overall routing process of the nets in a circuit. It does this by running directors, director 1 through director 4, 220A-220D. A director is a subroutine that selects what intents to process and in what order. Each of the directors 220A-220D (generally referenced by 220) attempts to achieve a particular high-level goal, an "intent", such as achieving compliance with one or more constraints, for example. The directors 220A-220D in the CCM 210 carry out their work by invoking one or more of the three functional modules, the SCR, the TOPO, and/or the DETAIL routing engine functional modules.

As with all autorouter functionality, the CCM subsystem 210 is also responsible for controlling multi-threading. Each Director 220 algorithm runs in the CCM subsystem 210. A director 220 can create multiple threads to service multiple Objectives simultaneously or it can create multiple threads all of which service only one Objective. The Objectives themselves cannot control how multi-threading is initiated but are to be thread safe if they are to be achieved using multiple threads. Concurrency can be in the form of several different tasks being performed by several different threads. For example, one thread can run the SCR to find alternate paths to reduce an overloaded channel. At the same time, two other threads can run TOPO algorithms to detect and repair other loads. Concurrency can also be in the form of several threads working on the same goal. For example, six threads could be popping Contexts off the TOPO priority queue and processing them simultaneously.

Therefore, the algorithms use only local data wherever possible. In particular, global variables are avoided in the constraint system.

Figure 3:
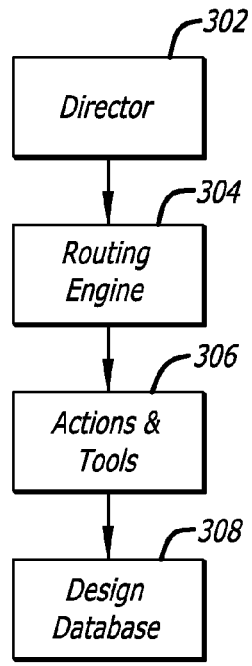
FIG. 3 is a functional block diagram of a conceptual model for the engines and tools of the object oriented autorouter.

Referring now to FIGS. 2A-2B and 3, in the object oriented autorouter 200A-200B, the middle layer of functional modules (the SCR, the TOPO and the DETAIL) are routing engines 304. Under the control of a director 302, each of these routing engines 304 has certain actions and/or tools 306 that can operate on the design database 308, such as the customer's engineering database 201 and/or the EDA vendor's engineering database 202 illustrated in FIGS. 2A-2B.

Constraints and Objectives may be plug-in modules that can be freely added or exchanged. The architecture of the object oriented autorouter spreads the algorithms for a particular constraint into several files.

To add a new constraint, a new Constraint Definition class is defined and implemented. The related classes are added: a Constraint Status class, an SCR handler, a Topo handler, and a Detail handler; and Constraint Definition objects are generated for this new constraint.

Typically with the architecture of the object oriented autorouter, the routing algorithms in the SCR, TOPO and DETAIL routing engines do not need to be changed to support a new constraint. If they do need changes, those changes are likely to be very isolated such that adding a new constraint is unlikely to break support for existing constraints.

The architecture of the object oriented autorouter allows custom constraints to be configured by different customers. For example, suppose customer A wants support for a particular customer-defined constraint and customer B wants support for a different customer-defined constraint. Customer A doesn't want customer B to have support for their customer-defined constraint and vice versa. This would typically lead to many custom builds of an autorouter. In each case, additions are made to several modules throughout the object oriented autorouter to support the custom constraints.

Instead with reference to FIG. 2A, linkable libraries can be generated that when linked with the rest of the object oriented autorouter, produce a complete system with support for custom constraints that are unknown to the rest of the object oriented autorouter. The header files and object files are shared with the persons writing the constraint handlers.

As illustrated in FIG. 2A, the autorouter 200A includes application programming interfaces 231A, 232A, 233A providing an interface to respectively couple the SCR handlers 221 to the SCR engine 211A, the TOPO handlers 222 to the TOPO routing engine 212A, and the DETAIL handlers 223 to the DETAIL routing engine 213A. The autorouter 200A further includes application programming interfaces 234A and 235A to provide an interface to respectively couple the constraint status 224 and the constraints 225 to the RDM 214A.

A custom constraint CNS A 225D has been included as part of the autorouter 200A, along with a custom constraint status 224D, a custom SCR handler 221D, a custom TOPO handler 222D, and a DETAIL handler 223D. The APIs 231A-235A interface these objects to the SCR engine 211A, the TOPO routing engine 212A, the DETAIL routing engine 213A, and the RDM 214A, respectively.

Alternatively with reference to FIG. 2B, subsystems of the object oriented autorouter can have a plug-in configuration with plug-in behavior so that new constraints can be added without creating custom builds of the object oriented autorouter. The new functionality would be added at load time and not during compilation (compile time) or linkage (link time).

To accomplish this, the constraints are implemented as run-time libraries (RTL) or dynamic linked libraries (DLL). The run-time library (RTL) or DLL includes the constraint definition, the constraint status class, the SCR handler class, the TOPO handler class and the DETAIL handler class. The subsystems (SCR, TOPO and DETAIL routing engines) are written as RTLs or DLLs so that the constraint handler RTLs or DLLs may call them. The RDM 214 is also written as a RTL or DLL so that the subsystem RTLs can access it.

FIG. 2B illustrates a custom add-on run time library or dynamic linked library (RTL/DLL) 250 including a custom constraint CNS A 225D read from the customer's engineering database 201. The custom add-on RTL/DLL 250 further includes the status object 224D, the SCR hander 221D, the TOPO handler 222D, and the DETAIL handler 223D for the custom constraint. The custom add-on RTL/DLL 250 and its objects are linked to the autorouter 200B through the application programming interface (API) 230.

The API 230 includes an SCR API 231B to link the SCR hander 221D for the custom constraint to the SCR 21 lB. The API 230 includes a TOPO API 232B to link the TOPO handler 222D for the custom constraint to the TOPO routing engine 212B. The API 230 includes a DETAIL API 233B to link the DETAIL handler 223D for the custom constraint to the DETAIL routing engine 213B. The API 230 further includes a Status API 234B and a constraint (CNS) API 235B for the custom constraint to respectively link the constraint status 224D and the custom constraint 225D to the RDM 214B.

Exemplary Constraints

In the early days of EDA, circuit designs had only simple spacing rules and physical rules to comply with. Today not only does an autorouter need to meet spacing rules and physical rules, but other timing and electrical rules need to be met. These rules are collectively referred to as constraints. Each constraint has data describing its rules and/or requirements, called a constraint definition. A constraint definition contains numeric data, such as the maximum delay on a net. The following are exemplary constraints for the various rules.

A) Spacing Rules

Spacing constraints are rules determining minimum clearance. That is, how close various objects on the design can be without causing electrical or manufacturing problems. For example, tracks had to stay a certain distance from other tracks. In the early days of EDA, minimum clearance rules were typically 25 mils (0.025 inches). Now, 2 mils clearance is not uncommon for a PCB and 10 microns (0.00001 meters) is not uncommon on packages. Devices with very small form factors, like cell phones, have extremely small clearance rules.

Perhaps surprisingly, this relentless progress toward smaller and smaller clearance rules had very little effect on autorouters, since this was just a number that was easily scaled. What has affected autorouting is the complexity of the spacing rules. Rather than one or two track widths and one or two spacing constraints, most designs now have many different spacing rules. And, the pin pitch (distance between pins in a package) now varies wildly from one device to another. This has forced PCB and Package routers to abandon gridded routing algorithms and to adopt gridless or shape-based routing algorithms. (In the IC realm, gridded routing algorithms can still used for many designs.)

There are many different types of spacing rules, such as spacing rules for the following objects:
Pin-to-pin
Line-to-pin
Line-to-line
Via-to-Pin
Via-to-via Via-to-line
Shape-to-pin
Shape-to-via
Shape-to-line
Shape-to-shape
Blind/buried via to blind/buried via Note that these spacing rules may be different on each layer of the circuit design and/or may be different in various regions of the same design.

Physical constraints may be assigned to specific nets or groups of nets. For example, different nets might have different track widths. As with spacing rules, early physical constraint rules were large, such as 25 mils (one-thousandth of an inch), and have gradually decreased to 2 mils and smaller.

Additionally, early physical constraints had simple rules, such as track width. In more complex designs of today, there are many more physical constraints that can be applied to a design. For example, physical constraints may be applied to a design based on rules for the following:

Min line width
Max line width
Min neckdown width
Max neckdown width
Diff pair primary gap
Diff pair neckdown gap
Min blind/buried via stagger
Allowable via padstacks B) Electrical Rules As clock speeds have increased, it is now common to have electrical constraints in routing nets, such as "maximum delay" constraints. Not only does the autorouter need to minimize total length but it has to do so in a way that does not exceed the maximum delay rules for these nets. Now, the routing engine has to refer not just to tables of clearance and physical constraints but also to electrical constraints on nets, often called "properties" or "attributes". The background FIG. 1 illustrates a crosstalk electrical constraint 121. A property is any numeric or textual value associated with a database object, such as a net or component. Most properties store constraint information. A property could also store a name, part number or other information that is not critical to the operation of an autorouter.

Initially, the electrical constraints were intended to prevent a signal from arriving too early or too late or to reduce the effect of "reflections" when a signal bounced and traveled backwards on its track.

Later, many more electrical constraints were added. Rules for the following exemplary list of electrical constraints may be described:

Propagation delay
Relative propagation delay
Diff pair phase limits
Net scheduling
Stub length
Max via count
Max parallelism
Max crosstalk
Peak crosstalk
Max exposed length There may also be rules established of which combination of layers can be used (Layer Sets and Layer Set Groups) in routing nets.

Conceptual Role of Constraints

As described previously, each constraint has data describing its rules and/or requirements, called the Constraint Definition. These contain numeric data, such as maximum delay.

In prior autorouters, the constraint definitions are only static data that are referred to during routing. For example, prior routing engines look up the required maximum delay value and then compare it to the current actual delay value. If the actual is less than the required maximum, then no action is taken. If the actual is too high, some routing algorithm is used to attempt to find a better path that meets the requirement. In prior autorouters, the constraint information is simply static information used by the routing algorithms throughout the routing process. In contrast, each constraint is an active participant in each of the routing engines in the embodiments of the invention.

Figure 4:
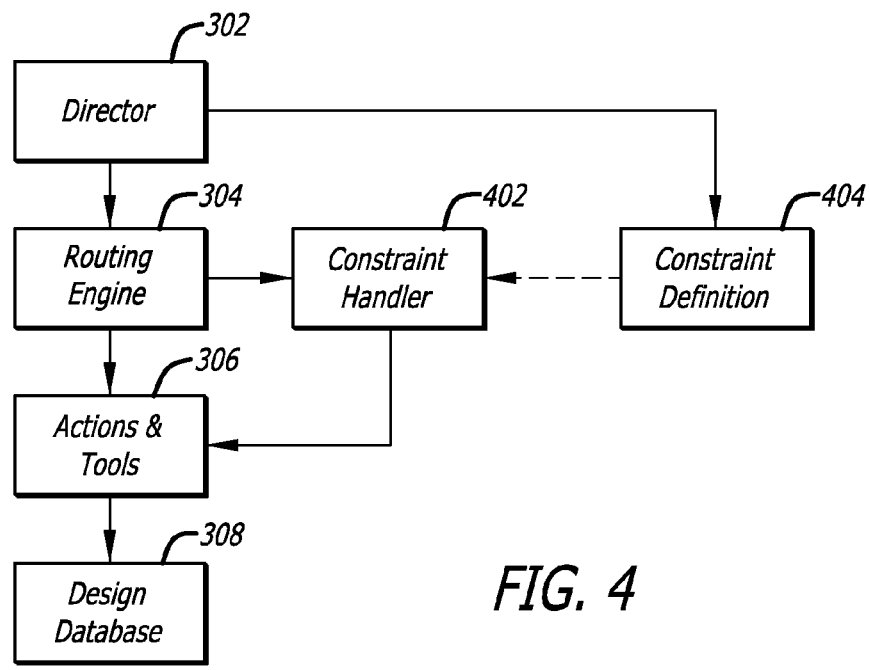
FIG. 4 is a functional block diagram of a conceptual model for the constraint definitions and handlers of the object oriented autorouter.

Reference is now made to FIGS. 2A-2B and 4. In the object oriented autorouter 200A-200B, each constraint can create a Constraint Handler 402 associated with its constraint definition 404. A constraint handler is a C++ class with specialized algorithms to work with one of the routing engines. In one embodiment of the invention, there are three routing engines (SCR, TOPO and/or Detail). In one embodiment of the invention, there are three types of constraint handlers, an SCR handler 221A-221D, a TOPO handler 222A-222D and a Detail handler 223A-223D respectively associated with the three routing engines 211-213 (SCR, TOPO and/or Detail). The SCR Handler 221A-221D is constraint handler in the SCR Handler hierarchy that adds additional control to SCR expansions. The TOPO Handler 222A-222D is a constraint handler in the TOPO Handler hierarchy that invokes topological Actions to improve compliance with a particular constraint. The DETAIL Handler 223A-223D is a constraint handler in the Detail Handler hierarchy that invokes geometric Actions to improve compliance with a particular constraint.

Although a Constraint Definition 404 knows only what its limits are, a Constraint Handler 402 knows how to control one of the routing engines 211-213 to achieve compliance. This knowledge of controlling one of the routing engines 211-213 to achieve compliance is implemented in the handler 402 associated with a constraint.

Directors 220A-220D of the CCM 210 notify a Constraint Definition 404 that it will be active for a particular routing process. The Constraint Definition object 404 then creates a Constraint Handler object 402 that participates in the routing process. That Constraint Handler 402 can then invoke any available Tools and/or Actions 306 for that routing engine 211-213.

In the embodiments of the invention, all information about Constraints are stored as a Cns object, a CnsStatus object, a CnsTopo handler object, and a CnsDetail handler object. The Cns object holds the actual rule (such as max 1 via). The CnsStatus object holds the current compliance status. The CnsTopo handler object knows how to improve compliance using Topo Actions. The CnsDetail handler object knows how to improve compliance using Detail Actions.

Note that Constraints do not need to know about each other in the object oriented autorouter. The Constraint priorities can be user controlled by using Design Intents. The Actions invoked by the handler objects do not need to know "why" they were invoked. The high-level algorithms in the object oriented autorouter do not need to know the specifics of the constraints, just their general nature.

Metaphor

To better understand the object oriented constraints and constraint handlers in the object oriented autorouter consider as a metaphor the process of tuning a race car before a race.

A Director in the CCM is a little bit like a race team's "crew chief". Both think of the "big picture". The crew chief looks at the season as a whole, not just one race. While winning a race is very important, having solid runs that get points is what is most important to winning the season. Similarly, the director considers routing nets as a whole in a circuit on an entire printed circuit board, in a package, or on a monolithic integrated circuit that is being routed.

The Tools and Actions in the object oriented autorouter can be thought of being like the many different aspects of a race car that can be modified. For example, different types of tires can be selected. The transmission can be configured with different gear ratios. The angle of the spoiler can be adjusted. The fuel mix ratios can be adjusted.

The Constraints for the object oriented autorouter are like the many rules and regulations of auto racing. For example, the National Association for Stock Car Auto Racing (NASCAR) has specific rules and requirements that must be met. In addition, each track is different with its own unique layout with hairpin turns and straight-aways. Even the weather predictions play a role.

The Constraint Handlers 402 are like the many specialists on a race team. For example, teams typically have a "shock specialist" who picks from over 100 different shock absorbers available and selects four or five choices to be brought to the track. Then, just prior to the race, the shock specialist will confer with other specialists to select the shocks that will be used during qualifying rules and during the actual race.

It's difficult, if not impossible, to get maximum performance if this tuning process is performed by a single person. There are too many choices, too many rules, and too many track differences for any one person to fully understand the entire process of tuning a race car or to understand the impact of each minor decision.

Similarly, in the case of autorouters, there are too many choices to be made during routing and too many potential constraints and requirements for a single routing engine to implement them all. Any attempt to do so would result in a software module of a single routing engine being large and unwieldy as well as prohibitively expensive to make it work correctly and maintain it for many years.

The key to success in autorouting highly-constrained designs is how the Constraint Handlers 402 (SCR handler, TOPO handler and Detail handler) interact. Just as team specialists confer with each other to configure a race car, the Constraint Handlers (SCR handler, a TOPO handler and a Detail handler) interact with each other to select optimal routing choices.

Directors, Objectives, and Actions

The constraint-driven-routing architecture of the object oriented autorouter is divided among software components in the form of:
Directives (High Level Intents)—general high-level routing logic;
Objectives (Low Level Intents)—specific low-level routing goals; and
Actions—algorithms that directly operate on design data.
A) Directors
A Director is a top-level routing control algorithm that implements an Intent. An intent is a goal to meet in automatically routing nets of a circuit. The Director determines which Objectives to apply to accomplish that Intent.

One exemplary Intent may be to find a global, topological solution that meets all of the electrical constraints but ignores some or all of the physical constraints. (This solution may have many physical design rule violations, such as crossed wires, but all of the electrical rules, such as maximum lengths would be met.)

Another exemplary Intent may be to take a topologically completed design and transform it into a geometric design. This Intent may first apply the physical Objectives (creating geometric wires to implement the topological solution). Then, it can apply each of the electrical Objectives in some order.

Yet another Intent may be to automatically tighten or strengthen one or more design constraints. For example, after finding a complete geometric solution (one or more design constraints are all satisfied), it may be desirable to increase the physical clearance rules and reroute nets of a circuit to improve manufacturability. To do so, this Intent automatically adjusts one or more of the physical clearance rules and then applies its Objective to attempt to meet this new, more restrictive constraint. If no solution is found, it might return those constraints to their previous values. Conversely if one or more design constraints are not satisfied, a design intent may automatically relax one or more design constraints and apply its objective to find a geometric solution that meets the relaxed constraint to reroute nets of a circuit.

The Directors behave differently for each routing stage. There are many well known routing stages possible. In one embodiment of the invention embodiment, there are three different routing stages (Planning, Routing, and Improving) in routing nets.

Nets are typically routed as one or more series of connections over a topological graph or a geometric grid between a source Terminal (Pin or Via) and a target Terminal (Pin or Via). Each of the individual connections in a net between the source terminal and the target terminal may be referred to as a rat. A rat might be further subdivided into a plurality of RatLines, such as at a via or junction.

1) Planning Stage

During Planning, the top-level goal is to find a topological plan for each Net that meets some or all constraints: spacing, physical, and electrical but allows crossovers. That is, each RatLine of each Net has a topological path, called a DotPath, through arcs in the topological graph from its source Terminal (Pin or Via) to its target Terminal (Pin or Via). Each arc in the topological graph is referred to as a CutPortal.

During Planning, the order of the RatLines in each CutPortal, does not need to be correct. Most RatLines can cross most other RatLines with a few exceptions. For example, unrouted RatLines cannot cross routed RatLines that have been locked (frozen) by a user.

During Planning, the Directors may disable some of the constraints. For example, in early passes, relative propagation constraints will normally be disabled. A relative propagation constraint limits the delay for one RatLine or Pin-Pair to be a specific amount more or less than the delay of another specific RatLine or Pin-Pair. Since none of the delay lengths are known before the topological plan exists, only very crude estimates are possible. Rather than force an arbitrary goal in early routing passes, the CCM Directors will disable the constraint until more information is available. The individual RatLines can use their "natural" length without regard to the constraint.

Another example where Directors may disable a constraint is LayerSetGroups. A LayerSetGroup is a collection of LayerSets. Each LayerSet determines which routing layers can be used. When a LayerSetGroup constraint is defined for a particular Net, all connections for that Net must be routed only on the layers from one of the LayerSets in the LayerSetGroup. For example, if the LayerSetGroup consists of three Layer- Sets {2,3}, {4,5} and {6,7} then it would be illegal to route one of the RatLines of the Net on layers 2 and 3 and route another Ratline of the same Net on layers 6 and 7. Since the layers on which each Ratline will be routed are completely unknown at the start of routing, this constraint will be disabled during early routing passes. Only after the "natural" layers are selected during routing can a reasonable guess be made as to which LayerSet of the LayerSetGroup should be used. And, even then, that guess may be reconsidered in later routing passes.

Once sufficient information is available in the topological routing plan, a constraint budget manager (CBM) 250 is run to select target goals for all constraints that need them. The constraint budget manager 250 is a high-level constraint decision making process in the CCM 210 (see FIGS. 2A-2B). The constraint budget manager 250 uses the information from the layers used in the current topological plan to select goal LayerSets from LayerSetGroups. Similarly, the constraint budget manager 250 uses the current estimated propagation delays for the current topological plan to set target propagation delays for matched groups and for relative propagation delays.

With this new goal information, the directors 220A-220D in the CCM 210 will run more planning passes to determine if these goals can be met. If not, the constraint budget manager 250 is run again until a solution is found.

At the end of planning stage, each RatLine will have a topological plan and each constraint will be met (to the approximate data available with only planning information). However, many RatLines may cross over each other.

The planning stage of a router is more fully described in U.S. patent application Ser. No. 11/115,042 entitled "Method and Mechanism for Implementing Automated PCB Routing" filed by Ken Wadland et al. on Apr. 25, 2005 which is incorporated herein by reference.

2) Routing Stage

Once the planning stage for routing the circuit is completed, the next top-level goal is to perform the actual routing of nets for the circuit. The goal during the routing stage is to create actual geometric routing segments and vias and to eliminate all crossovers and constraint violations.

During the routing stage, the routing information can be in any mix of the following three states: Planned routing information, sequenced routing information, and detailed routing information.

Planned routing information is defined by a topological plan. A topological plan is a topological path through a planar graph (described further below) that ignores crossovers between two or more topological paths. It indicates which channels the path of a net goes through. However, a topological plan does not determine the order in which the paths of the nets go through the channels. At the beginning of the routing stage, all nets will have only planned information unless portions of the design have already been partially routed (manually or automatically).

Sequenced routing information is defined by a topological path. A topological path is similar to a topological plan except that crossovers between two or more sequenced paths are considered a violation. At some point in the routing process, substantially all nets reach the sequenced state with sequenced routing information.

Detail routing information is defined by a geometric path. A geometric path consists of an ordered sequence of geometric shapes (described further below). Eventually, every net is defined in terms of geometric paths.

During the routing stage, the CCM directors 220A-220D might disable certain constraints or might make some constraints "more important" than others by adjusting cost functions.

Ideally, routing proceeds from planned state (topological plans) to sequenced state (topological paths) to detailed state (geometric paths). In reality, this is unlikely to be a one-way street. There will be cases where geometric paths may need to be ripped up and rerouted. There will be cases where sequenced data may need to be ripped up and planned again.

The Routing Stage is considered finished when a complete geometric solution has been found. A complete geometric solution is found when each Net is detail routed using segments and vias and every constraint (spacing, physical and electrical) is satisfied.

Undoubtedly, there may be some cases where the object oriented autorouter will never be able complete the Routing Stage by finding a complete geometric solution. When this occurs, a user may intervene. The user may make adjustments in the input data (placement, netlist or constraints) and rerun the object oriented autorouter to find a complete geometric solution. In other cases, a user may make adjustments to bundles and flows using an Interconnect Flow Planner (IFP) as described in U.S. patent application Ser. No. 11/492,021 entitled "User Guided Autorouting", filed by Ken Wadland et al. on Jul. 25, 2006 which is incorporated herein by reference and rerun the object oriented autorouter to find a complete geometric solution. And finally, in some cases, a user may manually route some of the nets and rerun the object oriented autorouter to find a complete geometric solution.

B) Objectives

An objective is a low-level algorithm that determines which actions to invoke in a routing engine. Objectives are the main goal-oriented algorithms of the object oriented autorouter. Each algorithm attempts to satisfy some particular goal.

Objectives can be based on "costs" or "goals". An example of a cost-based objective is finding a path (of segments and vias) that connects two terminals of a particular RatLine. There are few guarantees with cost-based objectives. For some cost formulas, the solution found is not guaranteed to meet all of the relevant constraints (because failure to meet a solution might not have infinite cost). The solution is not guaranteed to be the lowest cost solution (because early exits might cause it to miss better solutions). In some cases, it is not guaranteed to even find a solution when one exists (due to pruning).

A plurality of objectives may be applied to route nets in a circuit. A sequential order may be determined to apply the design constraints in routing the nets of the circuit by assigning relative priorities to the design constraints and then sorting the relative priorities of the design constraints. The relative priorities of the design constraints may be user specified priorities.

C) Actions

In one embodiment of the invention, each constraint has a handler 221-223 for each of the three routing engines (SCR, TOPO, DETAIL) 212-213. Each of the three routing engines 212-213 has its own data representation. Additionally, the database (RDM) 214 has its own data representation. The constraint system of the autorouter functions with each of these data representations. Each of the routing engines has its own actions that can be invoked. An action is a function which operates on the data. There are many actions that can be performed. Additional routing engines may be formed to support specific actions that can be taken to route nets in a circuit. Alternatively, less than three routing engines of greater complexity may be used to perform the actions to route nets.

In order to be a participant in the decisions made in each of the three engines, each constraint has a handler for each of the three data representations which understand the available actions for that routing engine.

1) Actions in the Detail Router

The detail router 213 represents the design data using a spatial model. The spatial model in the RDM database 214 is viewed as shapes (low-level geometric data), which can be searched using a geometric search engine. That is, the detail router 213 works on the design data from the viewpoint of a geometric search engine using the spatial model. The spatial model includes wires and pins of various shapes. The spatial model can be generated on the fly from the RDM database 214 and destroyed after the algorithm is completed and exited. Or, it could be stored as persistent data in the RDM. Optionally, a state of push-states for the wires could be maintained by the spatial model.

The geometric search engine allows traversals of the data based on geometric criteria. For example, the geometric search engine can search with a criteria such as "find all other objects near this object". The actual storage mechanism for this view is hidden inside the geometric search engine. The storage mechanism may be a quad tree, a sector map, or any other geometrical organization of data. The detail routing engine uses the geometric search engine to query the data stored in the storage mechanism.

Figure 5:
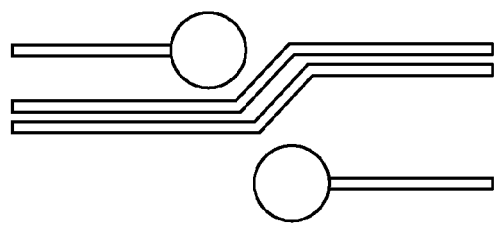
FIG. 5 is an exemplary spatial model of shapes on a single layer.
Figure 6:
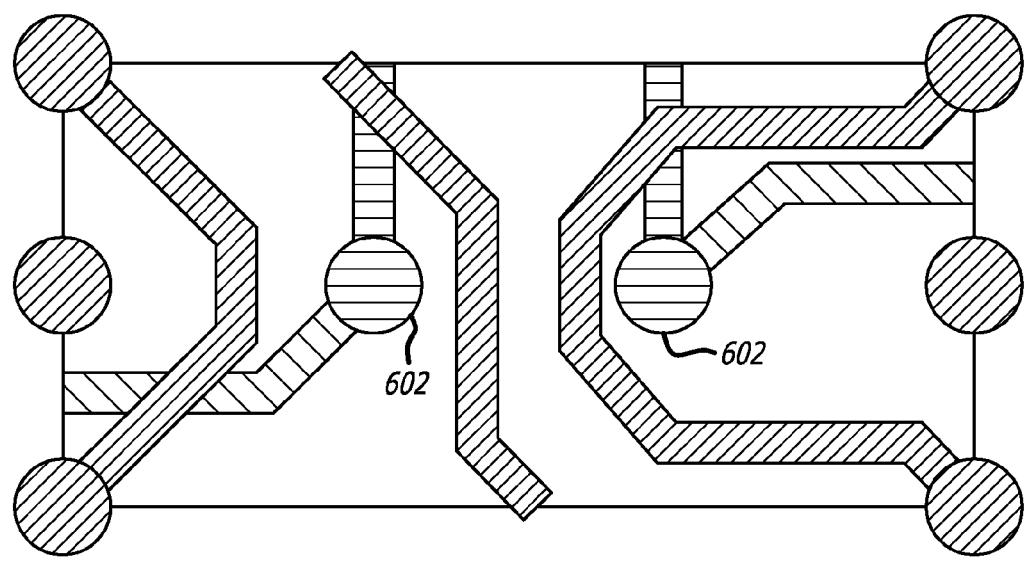
FIG. 6 is an exemplary spatial model of shapes on a plurality of layers.

Referring now to FIGS. 5 and 6, exemplary spatial models are illustrated. FIG. 5 illustrates shapes of one single layer of a spatial model. FIG. 6 illustrates shapes on three layers of a different spatial model including vias 602 connecting a net between multiple layers.

For a terminal, the shapes are typically round, rectangular or oblong. But they could be any shape supported by the RDM 214, including polygons.

For a routed path, the Shapes can be any sequence of Segments. Different types of segments may be used. For example, segments may be RoundSegments (line segments with width and rounded ends) or Arcs. Another Segment type is a tapered segment. Non-segment shapes may also be a part of a net. These non-segment shapes may be mapped to terminals by the object oriented autorouter.

Actions and tools 206 in the detail routing engine 213 operate on the Shapes. Examples of Detail Actions of the detail routing engine 213 are a) Shove Segment; b) Shove Terminal; c) Jump RatLine over Terminal; and d) Neckdown RatLine.

The shove segment action moves a segment to a new location while maintaining connectivity with the previous and following segments.

Figures 7A, 7B:
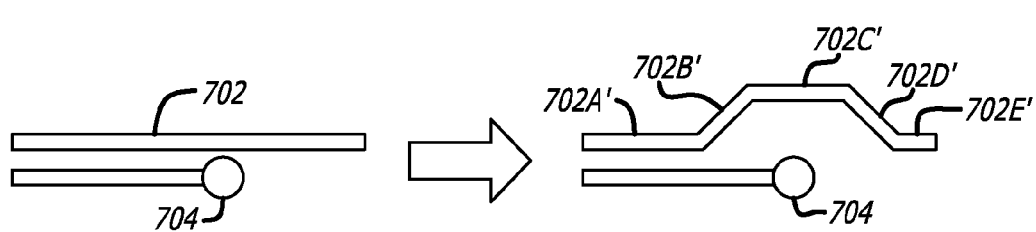
FIGS. 7A-7B illustrate an exemplary shove segment action.

FIGS. 7A-7B illustrate an exemplary shove segment action. In FIG. 7A, segment 702 is close to via 704. The segment 702 is shoved away from the via 704 to increase the clearance between the segment and the via. FIG. 7B illustrates the result of the shove segment action. The one Segment 702 is shoved to form five Segments 702A'-702E' as illustrated in FIG. 7B to increase the clearance in response to the shove segment action.

A shove terminal action is similar to the shove segment except that the Terminal moves on all of its layers. The shove segment action affects one layer.

FIGS. 8A-8B illustrate an exemplary detail shove terminal action. In FIG. 8A, the terminal 804 is close to the segment 802 similar to that of FIG. 7A. A segment 806 is coupled to the terminal 804.

The terminal 804 is shoved away from the segment 802 to increase the clearance between the segment and the terminal. FIG. 8B illustrates the result of the shove terminal action. The segment 806 is divided into two Segments 806A'-806B' and the terminal 804 is shoved away from the segment 802 as illustrated in FIG. 8B to increase the clearance in response to the shove terminal action.

A jump ratline over terminal action moves a RatLine path to the opposite side of a terminal.

FIGS. 9A-9B illustrate an exemplary detail jump ratLine over terminal action. In FIG. 9A, segments 901-902 are sandwiched between terminals 903-904. FIG. 9B illustrates the result of the jump ratline over terminal action. The segment 902 is divided into five Segments 902A'-902E' with a portion jumping to the opposite side of the terminal 904 as illustrated in FIG. 9B to increase clearance in response to the jump ratline over terminal action.

A Neckdown RatLine Action reduces a track width for a section of a RatLine (typically to squeeze between two Terminals).

FIGS. 10A-10B illustrate an exemplary detail neckdown ratline action. In FIG. 10A, segment 1002 is between terminals 1003 and 1004. The width of the segment 1002 is not a minimum line width and thus can be narrower. FIG. 10B illustrates the result of the neckdown ratline action. The segment 1002 is divided into three segments 1002A'-1002C' with the segment 1002B' being necked down to be narrower than segments 1002A' and 1002C' as illustrated in FIG. 10B to increase clearance in response to the neckdown ratline action.

Figures 11A, 11B:
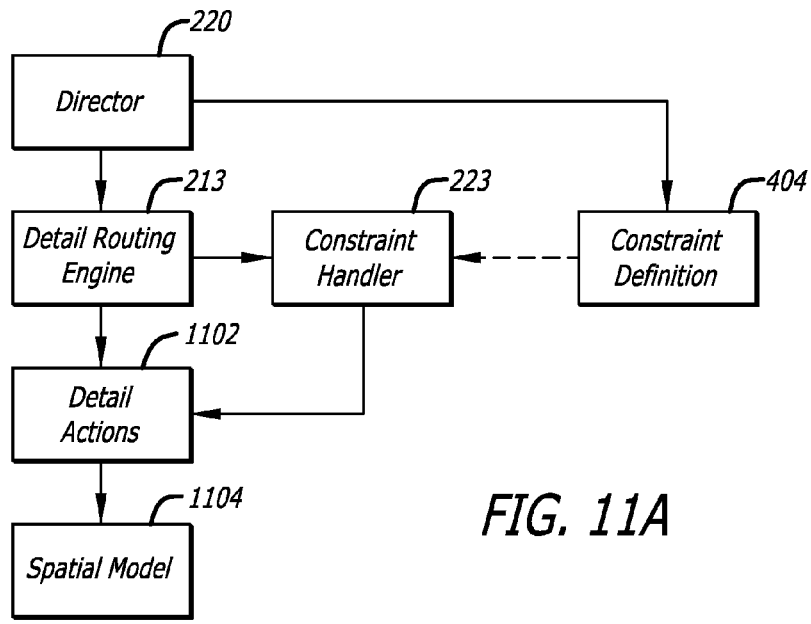
FIG. 11A is a functional block diagram of the interfaces to the detail constraint handlers of the object oriented autorouter.
FIG. 11B is a chart illustrating the separation of concerns for the detail routing engine into the categories of mid-level objectives, low-level actions, and state representation.

Referring now to FIG. 11A, the interfaces for the detail constraint handlers 223 are illustrated. A director 220 in the CCM generates the constraint definition 404 that is provided to the detail constraint handler 223. The detail routing engine 213 interfaces with the handlers 223 to invoke the detail actions 1102 to route nets associated with the constraint definition 404. The routed nets are saved as a spatial model 1104 in the RDM 214. All of the forgoing detail actions 1402 (shove segment action, shove terminal action, jump ratLine over terminal action, neckdown ratline action) are available to the detail handlers 223 associated with each constraint.

Referring now to FIG. 11B, a chart illustrates the separation of concerns for the detail routing engine into the categories of mid-level objectives, low-level actions, and state representation. Under the mid-level objective category, the detail routing engine is concerned with creating wires, improving wires (sometimes called cleaning or finishing), and the detail constraint handlers 223. Under the low-level action category, the detail routing engine is concerned with jump actions, shove actions and reflect actions. Under the state representation category, the detail routing engine is concerned with wires and push states.

The detail routing engine executes detail algorithms to route wires under a plurality of constraints. The main detail algorithm executed by the detail routing engine creates the initial wires of the circuit by ignoring all constraints except for shape-to-shape clearance constraints. For those nets having cns objects whose status is "not met", they are collected into a list of unsatisfied constraint objects. The detail routing engine sorts the list of unsatisfied cns objects by a priority measurement. For each cns object in the list of unsatisfied constraint objects, a handler is created and invoked to take action to satisfy each cns object. Note that DiffPair is slightly different because it affects two different RatLines and might require special processing.

After the nets of the circuit are initially routed and the list of unsatisfied constraint objects is empty, the detail routing engine may execute a detail improve algorithm to improve the routing of the nets under the plurality of constraints. The detail improve algorithm executed by the detail routing engine collects all cns objects (for Design or for selected objects) all of which have a status of "requirements met". The list of all cns objects is sorted by a user-specified priority. For each cns object of the list of all cns objects, a handler is created and invoked to improve status for each cns object.

2) Actions in the TOPO Routing Engine.

Figure 12:
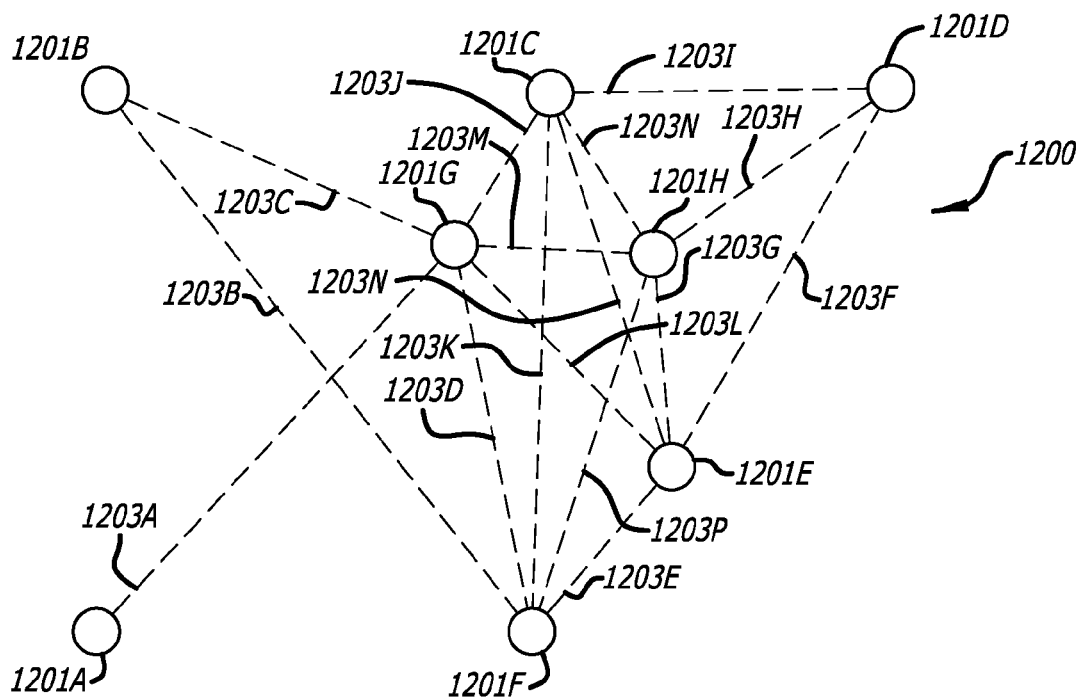
FIG. 12 illustrates an exemplary topological visibility graph.

Referring now to FIG. 12, the topo routing engine 212 operates using the structure of a topological visibility graph. A graph (in the computer science sense) is a data structure composed of nodes with arcs connecting those nodes. A topological visibility graph is a data structure where the nodes are connected if and only if they are "visible" to each other. In the topo routing engine, this means that the nodes are nearby topologically. The topological visibility graph includes joints and struts. The state of the topological visibility graph is saved as a context. The topological visibility graph is created on the fly from the SCR view of the planar graph and when bottlenecks occur. The topological visibility graph is typically destroyed upon completion and exit of the algorithm to conserve memory usage.

FIG. 12 illustrates an exemplary topological visibility graph 1200. The topological visibility graph 1200 has nodes in the graph are called Joints 1201A-1201E. They represent Terminals and other point-location objects. The arcs in this graph are called Struts 1203A-1203P. The topological visibility graph 1200 contains information on the RatLines that are planned to pass between the two Joints (graph nodes) at the ends of the Strut (graph arc).

A TOPO view of the database is created on-the-fly during Topo routing engine operations. The TOPO view of the database is discarded when that set of operations (typically an Intent) is completed.

Figure 13:
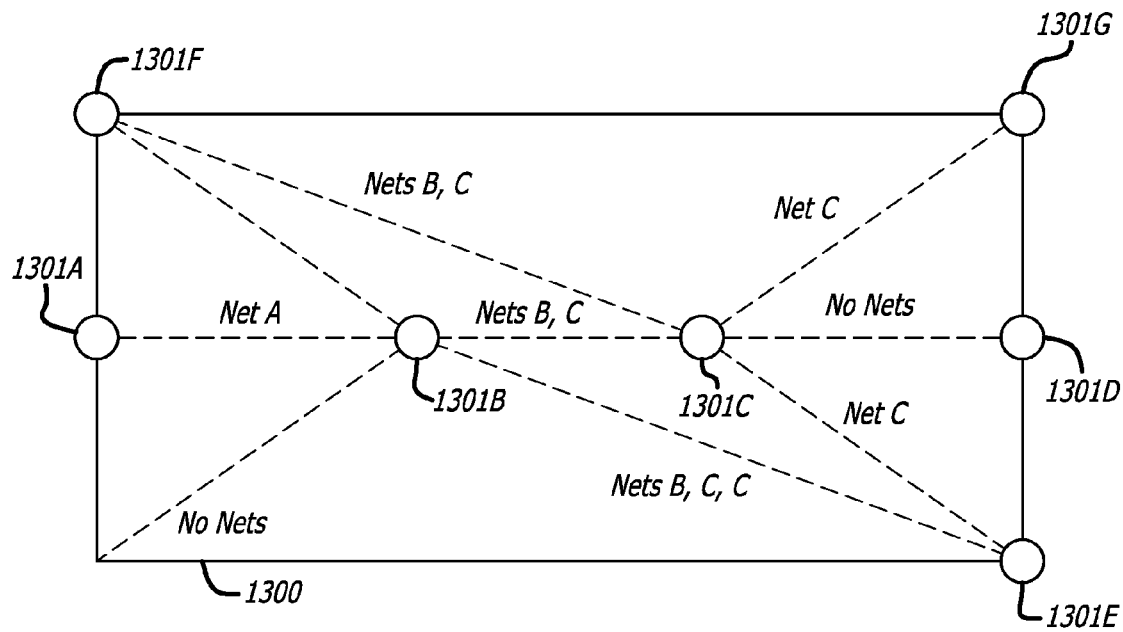
FIG. 13 illustrates another exemplary topological visibility graph.

FIG. 13 illustrates another exemplary topological visibility graph 1300. The topological visibility graph 1300 has Joints 1301A-1301G and nets A, B, and C to be routed between the joints. This graph is called the initial context.

The Topo Actions are topological transformations. They are similar to the Detail Actions except that they act on and modify the topological graph instead of geometric shapes.

Exemplary actions of topo routing engine include a) Shove Joint. b) Jump RatLine over Joint, c) Unwind RatLine, and d) Neckdown RatLine.

Figure 14:
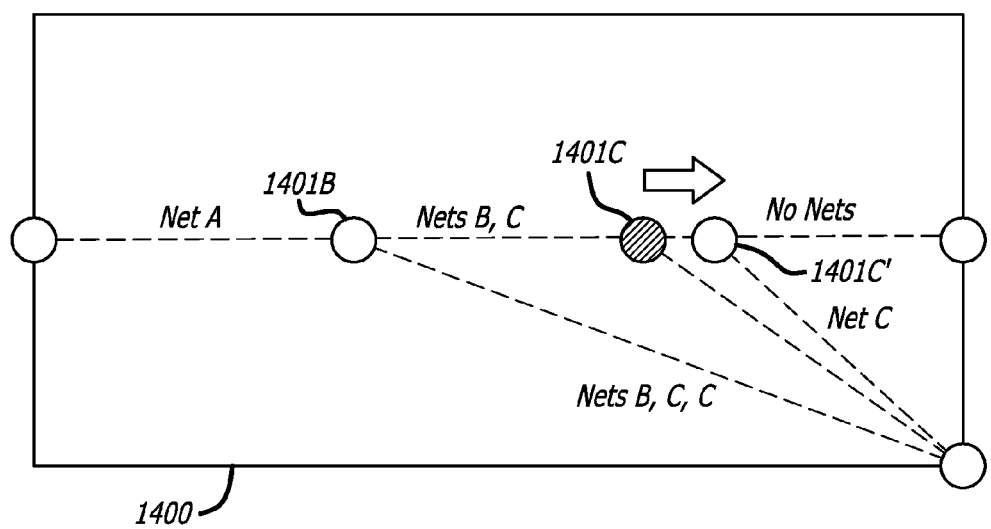
FIG. 14 illustrates an exemplary topological shove joint action.

Referring now to FIG. 14, a shove joint action consists of the algorithms required to move a joint (such as a via) from one location to another and to detect any design rule violations that are caused by moving the joint (such as a via).

FIG. 14 represents a new context where joint 1401C is shoved from its initial position in the topological visibility graph 1400 to joint 1401C' having a revised position. This may be to increase the spacing between joints 1401B and 1401C.

Figure 15:
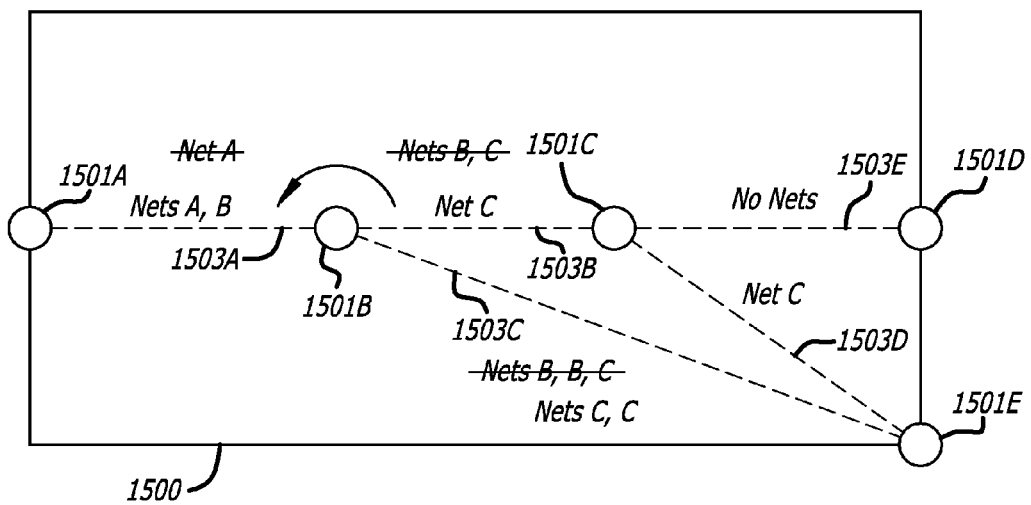
FIG. 15 illustrates an exemplary topological Jump RatLine over Joint Action.

Referring now to FIG. 15, a Jump RatLine over Joint Action consists of moving a RatLine from one side of a Joint to the opposite side of the joint. The Struts crossed by the RatLine are updated to reflect the new topology.

In the topological visibility graph 1500 illustrated in FIG. 15, initially net A is to be routed along strut 1503A between joints 1501A-1501B, nets B,C are to be routed along strut 1503B between joints 1501B-1501C, nets B,C are to be routed along strut 1503C between joints 1501B-1501E with net C crossing it twice, and net C is to be routed along strut 1503D between joints 1501C-1501E. No net is to be routed along strut 1503E between joints 1501C-1501D.

In response to the Jump RatLine over Joint Action, the routing of net B along strut 1503B is jumped over joint 1501B so that net B is instead routed along strut 1503A along with net A as illustrated in FIG. 15. Further, as indicated in FIG. 15, net C alone is to be routed along strut 1503B and net C, is to be routed along strut 1503C, crossing it twice.

Figure 16:
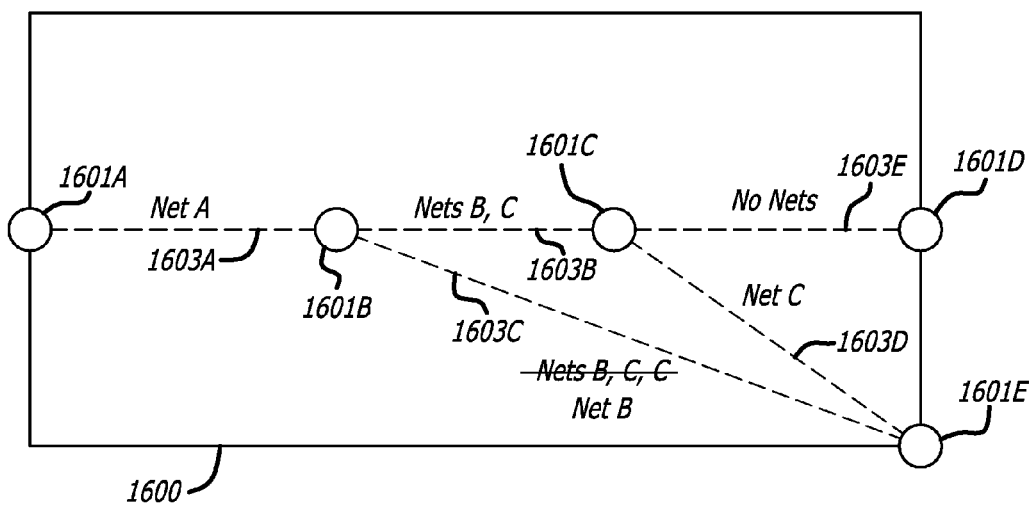
FIG. 16 illustrates an exemplary topological unwind Rat-Line action.

Referring now to FIG. 16, an unwind ratline action removes a RatLine from a Strut when the RatLine crosses that Strut twice.

FIG. 16 illustrates an exemplary topological visibility graph 1600 with joints 1601A-1601E and struts 1603A-1603E. Initially, prior to the unwind ratline action, nets B, C, C are to be routed along the strut 1603C between joints 1601B-1601E. Initially, net C is to be routed twice along strut 1603C.

In response to the unwind ratline action, the net C ratline that crosses the strut 1603C is removed. The net B ratline is routed alone along strut 1603C.

A neckdown ratLine action consists of changing the track width for a particular RatLine from its normal track width to a reduced neckdown width. In this case, there is no change in the topological visibility graph. Only the capacity/vacancy values of the ratline change.

Once a sequence of Actions is found that improves the overall cost, the Actions are backtracked and applied to the design database.

Figures 17A, 17B:
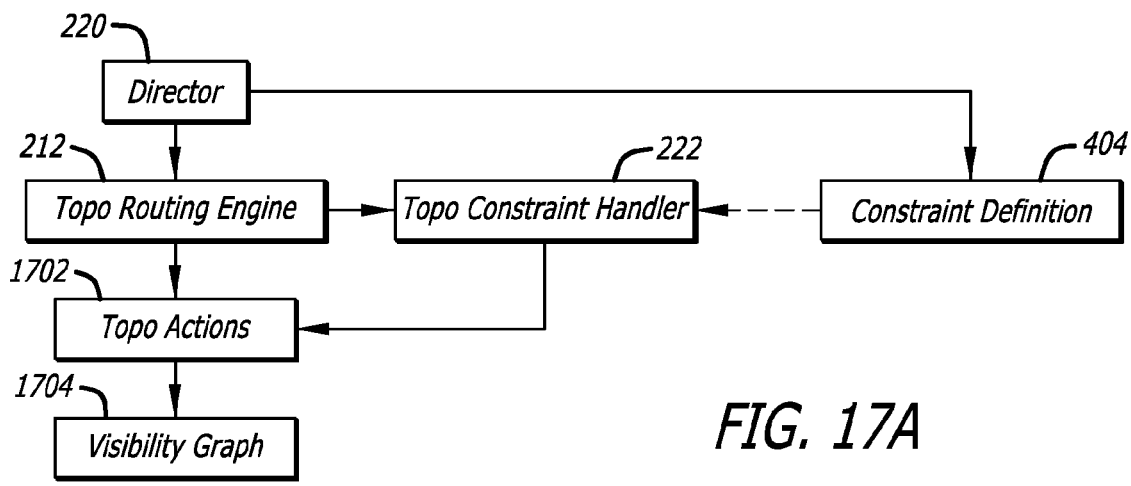
FIG. 17A is a functional block diagram of the interfaces to the topographical constraint handlers of the object oriented autorouter.
FIG. 17B is a chart illustrating the separation of concerns for the TOPO routing engine into the categories of mid-level objectives, low-level actions, and state representation.

Referring now to FIG. 17A, the interfaces for the Topo Constraint Handlers 222 are illustrated. A director 220 in the CCM generates the constraint definition 404 that is provided to the TOPO constraint handler 222. The TOPO routing engine 212 interfaces with the handlers 222 to invoke the topo actions 1702 to route nets associated with the constraint definition 404. All of the foregoing Topo actions (Shove Joint action, Jump RatLine over Joint action, Unwind RatLine action, and Neckdown RatLine action) are available to the Topo Handlers 222. The routed nets are saved as a topological visibility graph 1704 in the RDM 214.

Referring now to FIG. 17B, a chart illustrates the separation of concerns for the TOPO routing engine 212 into the categories of mid-level objectives, low-level actions, and state representations. Under the mid-level objective category, the TOPO routing engine 212 is concerned with resolving terminal overloads, resolving cutportal overloads, and the TOPO constraint handlers 222. Under the low-level action category, the TOPO routing engine 212 is concerned with jump actions, shove joint actions, and unwind actions. Under the state representation category, the TOPO routing engine 212 is concerned with transforming one context into another context.

Note that the TOPO routing engine is only needed when a topological router is to be provided. Additional details regarding the TOPO routing engine 212 are provided in U.S. patent application Ser. No. 11/098,039 entitled "Method and Mechanism for Implementing PCB Routing" filed by Ken Wadland et al on Apr. 1, 2005 which is incorporated herein by reference.

3) Actions in SCR Routing Engine

The Single Connection Routing (SCR) engine 211 works from the viewpoint of a planar graph. A planar graph is a graph in which arcs never cross each other. The planar graph is created upon startup of the RDM database and destroyed typically upon shutdown of the autorouter or when the circuit design is destroyed. The state of the planar graph is maintained by probes. The planar graph includes nodeportals and cutportals. Note however, a typical geometric SCR engine may be used in an alternative embodiment, such as a geometric SCR engine that is based on rectangles instead of a planar graph.

Figure 18:
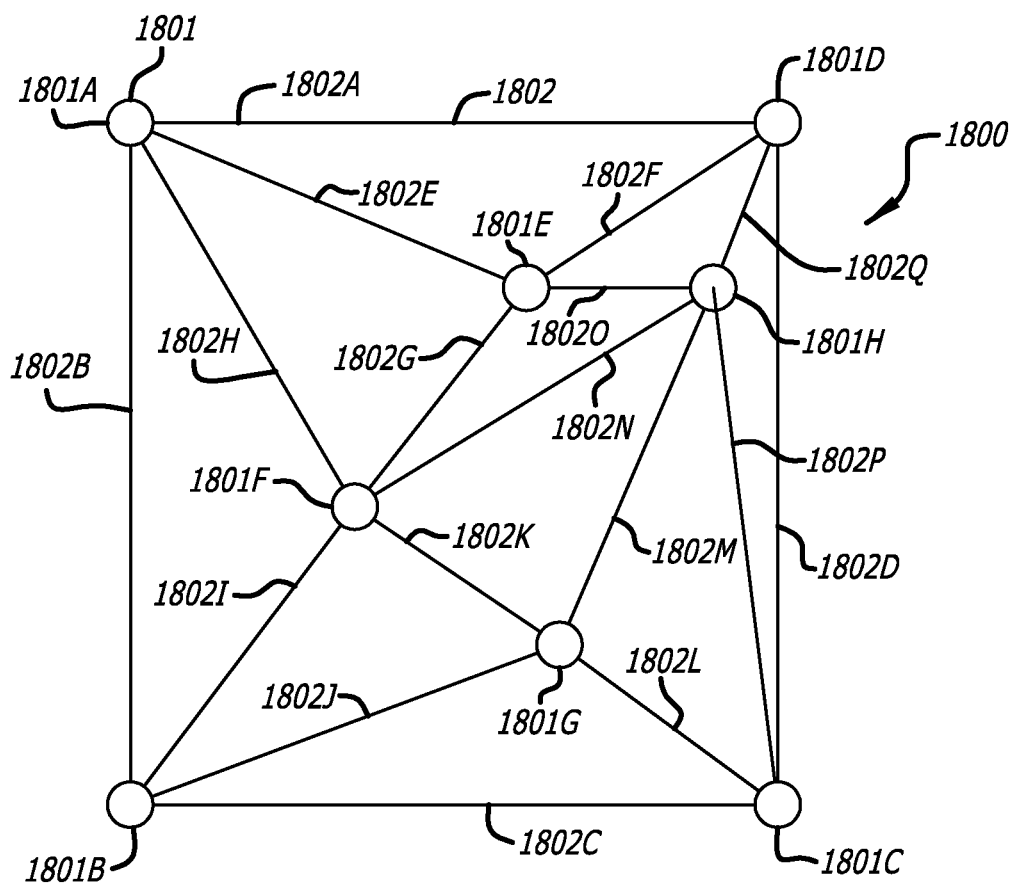
FIG. 18 is an exemplary planar graph.

Referring now to FIG. 18, an exemplary Planar Graph 1800 is illustrated. The nodes in the Planar Graph 1800 are NodePortals 1801. A nodeportal 1801 can represent anything that has a known coordinate, including terminals (such as Pins and Vias) and vertices of Keep Out areas. The arcs in the Planar Graph 1800 are CutPortals 1802. The CutPortals 1802 store information as to their occupancy and capacity and which RatLines are planned to cross them. The exemplary Planar Graph 1800 includes a plurality of nodeportals 1801A-1801H and a plurality of cutportals 1802A-1802Q positioned as shown in FIG. 18.

Figure 19:
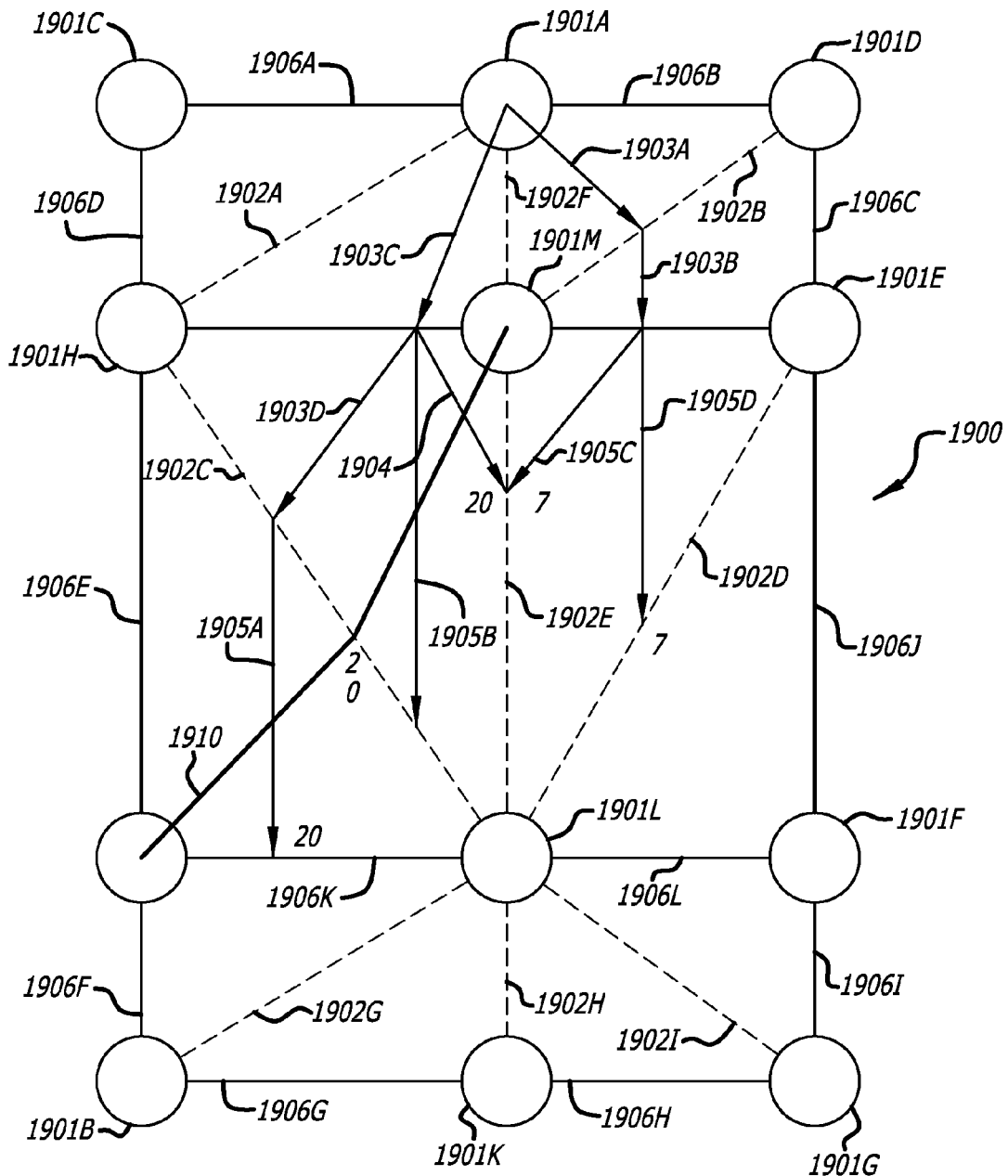
FIG. 19 illustrates exemplary expansion from a source terminal to a target terminal in an exemplary planar graph.

Referring now to FIG. 19, the purpose of SCR engine 211 is to find a path from one or more source Terminals 1901A to one or more target Terminals 1901B. It does so by creating probes 1903A-1903D, 1904 and expanding them to form new probes 1905A-1905D which represent partial paths. Once a full path from a source terminal to a target terminal is found, the SCR engine 211 installs that path in the database in the form of a portion of a planar graph 1800.

FIG. 19 shows several exemplary expansions from the source terminal 1901A to the target terminal 1901B. Probes 1903A-1093D represent a four exemplary expansions. Probe 1904 represents a $5^{th}$ exemplary expansion. Probes 1905A-1905D represent further exemplary expansions. Each expansion is one step in extending a partial path from one portal to another portal.

Each expansion is assigned a cost based on the desirability of that expansion plus the cost of reaching that expansion from the source. In one embodiment of the invention, a legal least costly probe in an expansion may be acquired (pursued and processed) as a part of the path from a source terminal to a target or destination terminal. Probes that are not pursued are considered to be a wave front. A probe is legal if it meets the constraints.

In FIG. 19, the numbers illustrated next to the probes 1905A-1905D are the exemplary costs that may be associated with the additional expansions As probe 1905D is illustrated with the lowest cost (number 7) and may meet spacing constraints with the net 1910 previously routed, probe 1905D is likely to be acquired.

One or more additional numbers may be associated with each probe to represent the desirability of routing path along the path of that probe. For example, probe 1905C may have a cost of 7 and a desirability of 15 and probe 1905D may have the same cost of 7 but only a desirability of 10. In this exemplary case, the probe 1905C may be selected to be acquired over that of probe 1905D as the desirability of 15 is greater than 10.

There are two actions available in the SCR routing engine 211, an increase cost action and a split probe action.

An increase cost action adds a numeric value to the Probe's cost. For example, the cost of 7 for probe 1902D may be increased to 12 by adding a cost of 5 in response to an increase cost action by the SCR routing engine 211. A large cost associated with a probe, a large number such as 7777777 that may represent infinity, indicates that the Probe should be pruned, that is, not expanded.

A split probe action creates one or more new probes which expand independently from the original probe. For example, assume probe 1905B was an original probe in the second expansion. Probe 1905B may split into probes 1903D and 1904 for example in response to a split probe action in the SCR routing engine. As another example, assume probe 1905D is an original probe. Probe 1905D may split into probe 1905C for example in response to a split probe action in the SCR routing engine.

Constraints can drive the SCR routing process by increasing costs. A split probe action may also be available to the SCR Constraint Handlers.

SCR Constraint Handlers have the ability to store a state in each Probe. When an SCR Constraint Handler is created, it can request an allocation of memory within each Probe. This can be used for any purpose within the Handler. Typically the state is used to tally the amount of its resource that has been consumed. For example, a max via constraint handler would keep track of the number of vias in the partial path up to that Probe. A max propagation delay handler would keep track of the propagation delay in the partial path.

Figures 20A, 20B:
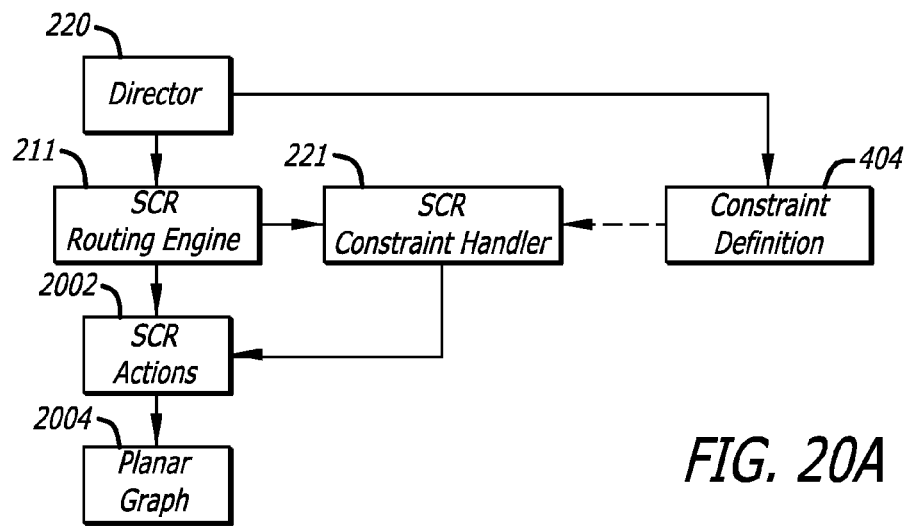
FIG. 20A is a functional block diagram of the interfaces to the SCR constraint handlers of the object oriented autorouter.
FIG. 20B is a chart illustrating the separation of concerns for the SCR routing engine into the categories of mid-level objectives, low-level actions, and state representation.

Referring now to FIG. 20A, interfaces to the SCR Constraint Handlers 221 are illustrated. A director 220 in the CCM 210 generates the constraint definition 404 that is provided to the SCR constraint handler 221. The SCR routing engine 211 interfaces with the handlers 221 to invoke the SCR actions 2002 to route nets associated with the constraint definition 404. One or both of the SCR actions (an increase cost action and a split probe action) are available to the SCR Handlers 221. The routed nets are saved as a planar graph in the RDM 214.

Referring now to FIG. 20B, a chart illustrates the separation of concerns for the SCR routing engine 211 into the categories of mid-level objectives, low-level actions, and state representations. Under the mid-level objective category, the SCR routing engine 211 is concerned with routing (finding a new or improved path) for one Rat or RatLine and with the SCR constraint handlers 221. The low-level action category can use any of many well known path finding algorithms. In the preferred embodiment, the low-level actions for the SCR routing engine 211 consist of expansion actions (probes) from nodeportals and cutportals to other nodeportals and cutportals.

Class Hierarchies

The constraints are implemented in five tightly coupled hierarchies of C++ classes. These hierarchies are (i) Constraint Definitions, (ii) Constraint Status, (iii) SCR Constraint Handlers, (iv) TOPO Constraint Handlers, and (v) DETAIL Constraint Handlers.

Each of the constraint hierarchies is designed for a particular database view and is optimized to take advantage of that database view's features. The database views include a spatial model (see for example FIG. 5), a topological visibility graph (see for example FIG. 12), and a planar graph (see for example FIG. 18), previously described. Accordingly, each of the SCR, TOPO, and DETAIL routing engine subsystems has its own world view with its own data structures and its own search algorithms that are optimized for that subsystem. While the views can set to view tiles, none of the views are so limited. Most of the algorithms in each of the subsystems can ignore tile boundaries but for a few special processing exceptions needed for Tile boundaries. One exception is an EdgePortal in a planar graph where the SCR routing engine has extra processing for via expansion. Another exception is during walkback, where the TOPO routing engine needs to fix up DotLines in the topological visibility graph. Another exception is when changes cross boundaries in the spatial model, such as when the DETAIL routing engine fixes up the wires of DotLines. These are described in additional detail in U.S. patent application Ser. No. 11/098,039 previously incorporated by reference.

Figure 21:
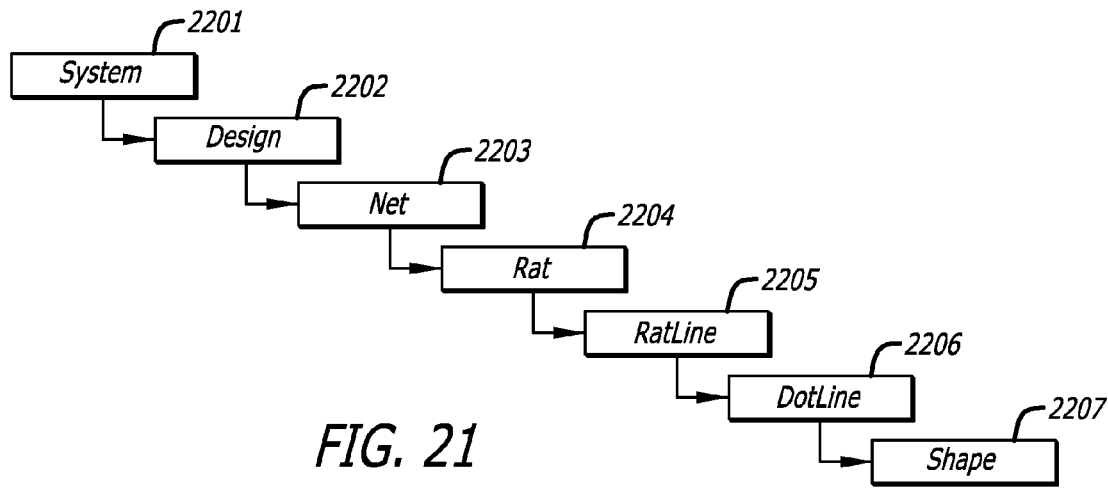
FIG. 21 is an exemplary hierarchical database view of a circuit design.

Referring now to FIG. 21, the database views further include a hierarchical database view of a circuit design. The hierarchy in the hierarchical database view includes at least two of a system level 2101, a design level 2102, a net level 2103, a rat level 2104, a ratline level 2105, a dotline level 2106, and a shape level 2107. The structure of the hierarchical database view is an object-oriented database. It is created on startup from a design database and destroyed upon shutdown after completing the routing. The hierarchical database view maintains the state of various transactions of each level.

Figure 22:
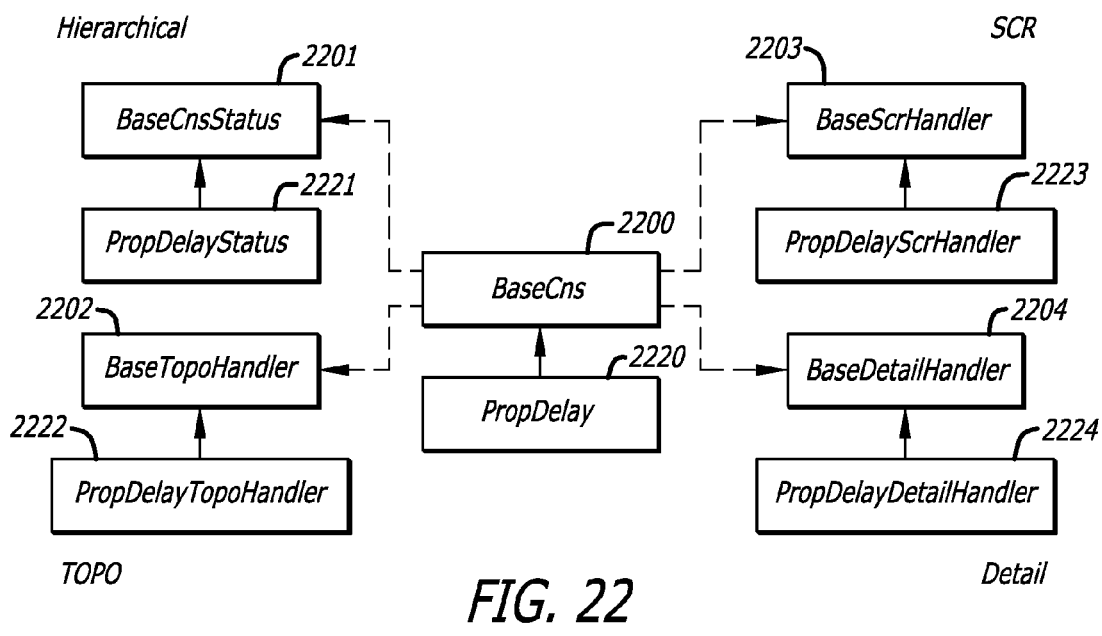
FIG. 22 is a diagram illustrating the mapping of constraint objects in the constraint hierarchies to the four database views.

Referring now to FIG. 22, conceptually the constraint hierarchies ((i) Constraint Definitions, (ii) Constraint Status handlers, (iii) SCR Constraint Handlers, (iv) TOPO Constraint Handlers, and (v) DETAIL Constraint Handlers) are all parallel. For each concrete Constraint Definition 2200, there is a corresponding concrete TOPO Constraint Handler 2202. Additionally, there may be a corresponding concrete constraint status 2201, concrete SCR handler 2203, and/or concrete detail handler 2204. However, this is not always a one-to-one relationship. For example, several Constraint Definitions may be implemented to have the same TOPO Constraint Handler, if the differences between the constraints are not important or can be hidden in the handler.

For example with reference to FIG. 22, a Constraint Definition class (prop delay 2220) that defines that constraint's properties 2200. This is a permanent data structure and has a factory function that can construct a Propagation Delay Status object 2221 that works with the hierarchical view of the database. It also has factory functions that can create a prop delay SCR Handler object 2223, a prop delay Topo Handler object 2222, and a prop delay Detail Handler object 2224. Thus, it is possible to create objects designed to work with any of the four database views. The constraint objects are designed to use the various database views (Hierarchical, SCR, TOPO, DETAIL).

1) Constraint Definition Hierarchy (BaseCns)

Each "Constraint" is a collection of tightly related sets of algorithms. In the embodiments of the invention, these algorithms are packaged as C++ classes. However, they could be implemented in Java, C#, and any other object-oriented programming language. For purposes of this invention disclosure, each set of algorithms will be referred to as "classes". The important feature of these "classes" is that they can be arranged into "hierarchies". In a hierarchy, a class can be derived from another class, called its "superclass" and other classes can derived from it, called "subclasses". Each derived subclass can "inherit" features from its superclass. The topmost superclass is called the "base" class. The lowermost subclasses are called "concrete" classes.

The major hierarchy supporting constraints is the Constraint Definition Hierarchy, abbreviated as "Cns". It's root class is "BaseCns". The base constraint definition hierarchy is used to store the definition of each constraint. There is one concrete subclass in this hierarchy for each different type of constraint.

Figure 23A:
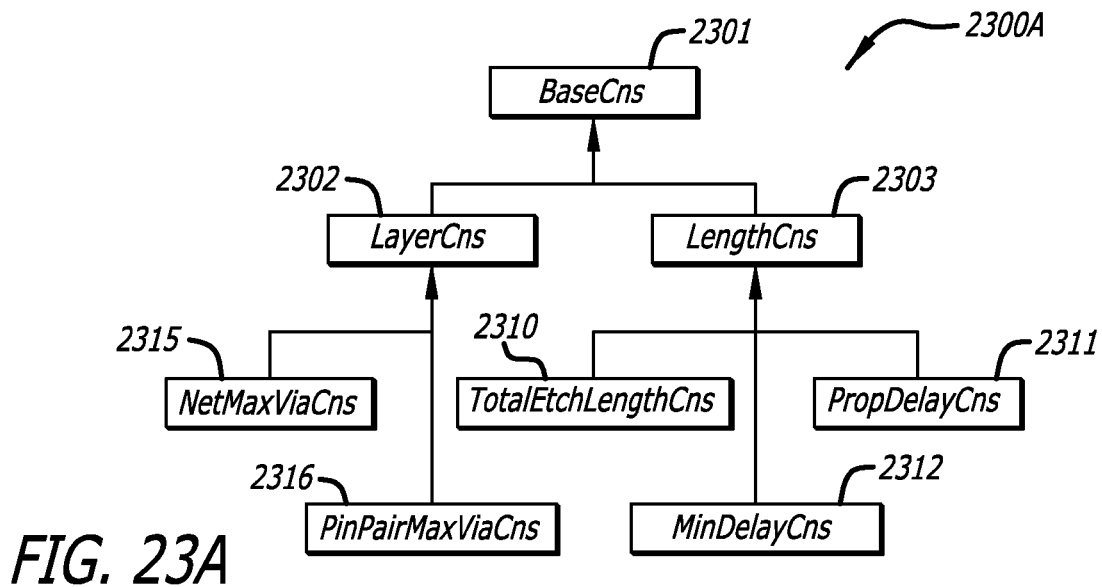
FIGS. 23A-23C illustrate exemplary base constraint definition hierarchies.
Figure 23B:
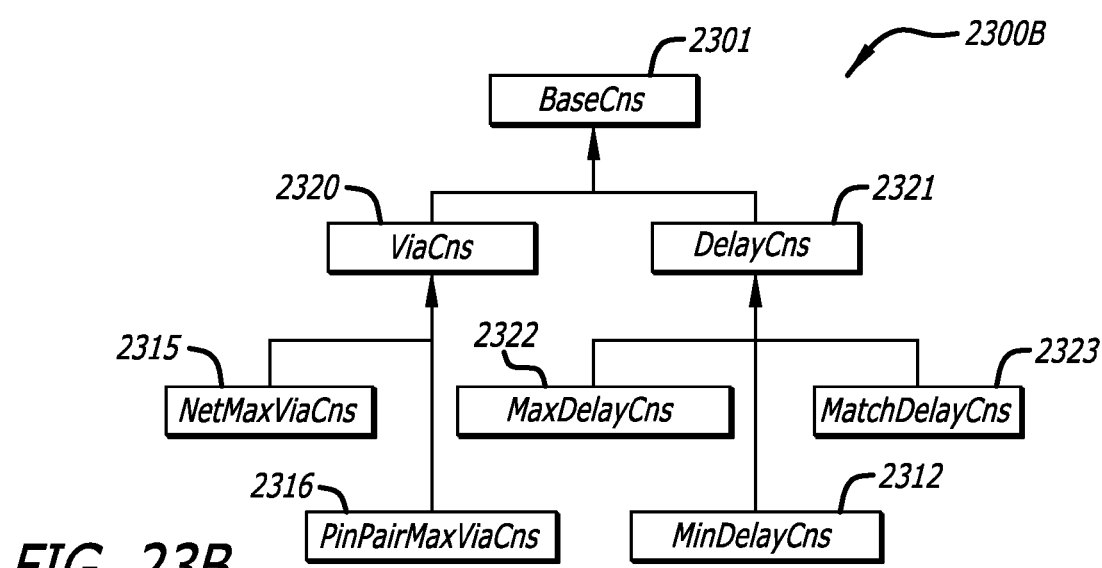
Figure 23C:
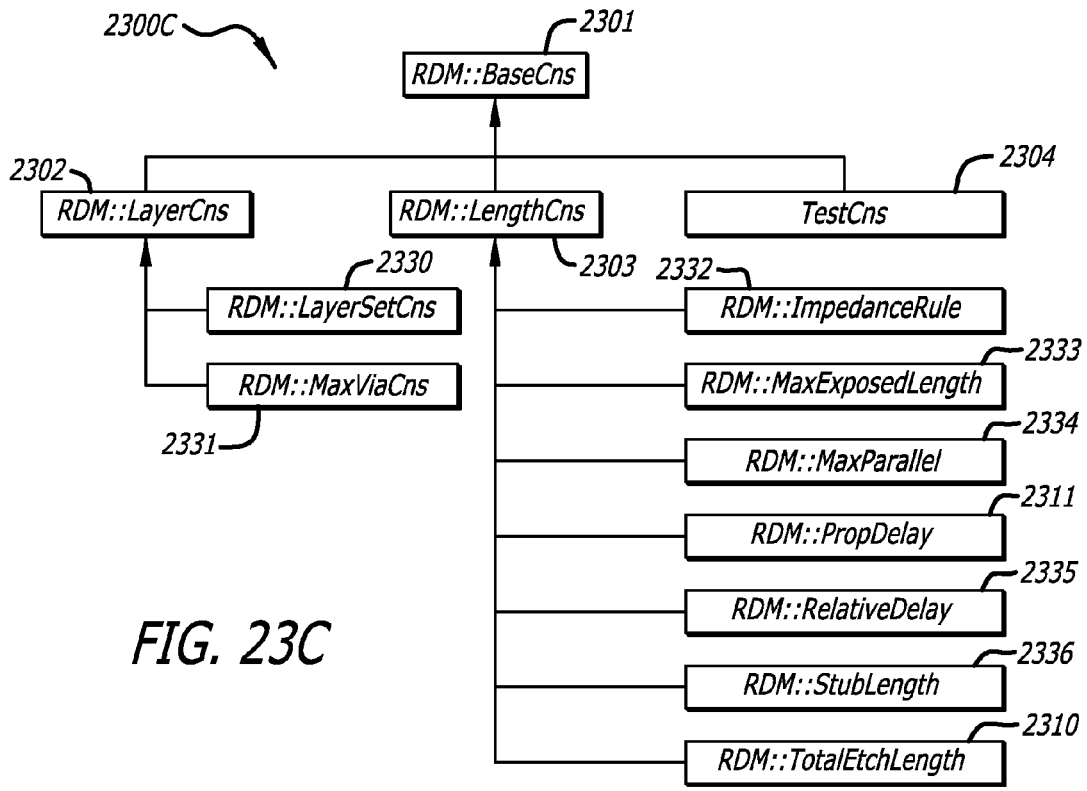

FIG. 23A illustrates a first exemplary base constraint definition hierarchy 2300A for the base constraint 2301. It is to be understood that the actual hierarchy may be larger with many more classes such as illustrated in FIG. 23C. Related classes have their own superclass, such as "LayerCns" 2302 and "LengthCns" 2303, forming sub-hierarchies to reduce code duplication. For example, the "LayerCns" 2302, an intermediate base class, has a sub-hierarchy including concrete subclasses of net max-via constraints 2315 and Pin-Pair max-via constraints 2316. The "LengthCns" 2303, an intermediate base class, has a sub-hierarchy including concrete subclasses of total etch length constraints 2310, propagation delay constraints 2311, and minimum delay constraint 2312. The length constraints may instead be defined as constraints related to delay and not length such as a maximum delay constraint, a match delay constraint, and the minimum delay constraint.

The concrete class "NetMaxViaCns" 2315 can be used to represent the maximum number of vias that a particular net can have. Another concrete class, "PinPairMaxViaCns" 2316, can be used to represent the maximum number of vias between a particular pair of terminal pins.

There can be many objects of each class type. For example, many different nets could have net max-via constraints 2315. There is one instance of each class for each such constraint attached to the appropriate object.

As discussed previously, the lowermost subclasses are called "concrete" classes. It is expected that, over time, the number of concrete classes in the base constraint definition hierarchy will grow considerably. The number of intermediate base classes in the base constraint definition hierarchy should grow much more slowly.

The Constraint Definition Hierarchy can be flexibly defined. FIGS. 23B-23C illustrated additional exemplary constraint definition hierarchies.

Referring now to FIG. 23B, a second exemplary constraint definition hierarchy 2300B is illustrated. Related concrete classes can have their own superclass, such as via constraints ViaCns 2320 and delay constraints DelayCns 2321, forming a sub-hierarchy. The class of via constraints 2320 is similar to the layer constraints 2302 including the concrete classes "NetMaxViaCns" 2315 and "PinPairMaxViaCns" 2316. However, the delay constraints DelayCns 2321 may have a different sub-hierarchy of concrete classes including maximum delay constraints MaxDelayCns 2322, match delay constraints MatchDelayCns 2323, and minimum delay constraint MinDelayCns 2312.

Referring now to FIG. 23C, a third exemplary constraint definition hierarchy 2300C is illustrated. Related concrete classes can have their own superclasses, such as layer constraints LayerCns 2302, length constraints LengthCns 2303, and testing constraints TestCns 2304.

The layer constraints 2302 may be defined to include the concrete classes of layer set constraints LayerSetCns 2330 and maximum via constraints MaxViaCns 2331.

The length constraints LengthCns 2303 may be defined to include the concrete classes of total etch length constraints TotalEtchLength 2310, propagation delay constraints PropDelay 2311, impedance rule constraint ImpedanceRule 2332, maximum exposed length 2333, maximum parallel length constraint MaxParallel 2334, relative delay constraint RelativeDelay 2335, and stub length constraint StubLength 2336.

There can be many objects of each class type. For example, many different nets could have max-via constraints. There would be one instance of each class for each such constraint.

The Constraint Definition Hierarchy implements an Abstract Factory Design Pattern such as described in the book entitled *Design Patterns: Elements of Reusable Object-Oriented Software*, by Erich Gamma, Richard Helm, Ralph Johnson, John Vlissides on pages 87-96, Copyright 1995, published by Addison-Wesley. That is, the root class (BaseCns) provides an interface to create families of related or dependent objects without specifying their concrete classes. More specifically, each Constraint Definition class provides a means of creating its corresponding objects in each of the four other related hierarchies. For example, if a NetMaxExposedLength object is asked for its Status object, a NetMaxViaCnsStatus object is created.

As discussed previously, the constraint hierarchies are parallel. The Constraint Definition Hierarchy may be used to generate objects for the Constraint Status handlers, the SCR Constraint Handlers, the TOPO Constraint Handlers, and the DETAIL Constraint Handlers in their respective hierarchy. In which case, the concrete objects in the Constraint Status Hierarchy, the SCR handler hierarchy, the detail handler hierarchy, and the TOPO handler hierarchy are parallel to the concrete objects in the Constraint Definition Hierarchy. Note that the intermediate base classes can be different for each hierarchy. The exemplary hierarchy depicted in FIGS. 24-27 are parallel to the exemplary constraint definition hierarchy 2300A of FIG. 23A. The exemplary hierarchy depicted in FIGS. 24-27 can be readily converted to be parallel to the exemplary constraint definition hierarchies 2300B-2300C of FIGS. 23B-23C instead.

2) Constraint Status Hierarchy (CnsStatus)

The Constraint Status Hierarchy has a root class referred to as CnsStatus. The Constraint Status Hierarchy is parallel to the constraint definition hierarchy and is used to record the current compliance with the corresponding constraints.

Figure 24:
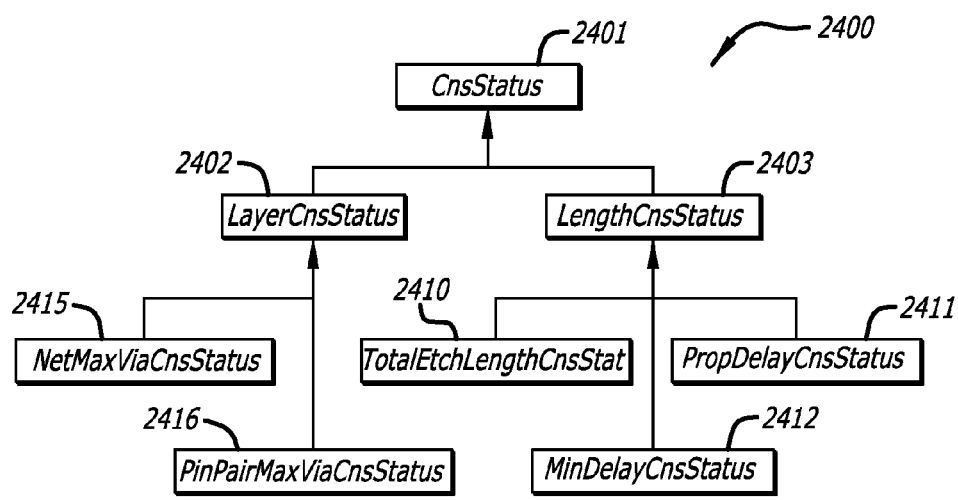
FIG. 24 is an exemplary Constraint Status Hierarchy.

Referring to now to FIG. 24, an exemplary Constraint Status Hierarchy 2400 is illustrated. It is to be understood that the actual hierarchy may be larger with many more classes parallel to that shown in FIG. 23C. The exemplary Constraint Status Hierarchy 2400 includes a layer constraint status LayerCnsStatus 2402 and a length constraint status LengthCnsStatus 2403 at an intermediate base class. The LayerCnsStatus 2402 has a sub-hierarchy including concrete subclasses of net maximum via constraint status NetMaxViaCnsStatus 2415 and pin pair maximum via constraint status PinPairMaxViaCnsStatus 2416. The length constraint status LengthCnsStatus 2403 has a sub-hierarchy including concrete subclasses of total etch length constraint status TotalEtchLengthCnsStatus 2410, propagation delay constraint status PropDelayCnsStatus 2411, and minimum delay constraint status MinDelayCnsStatus 2412.

Each Constraint Definition class is an abstract factory that can create its own CnsStatus objects. For example, if a PropDelayCns object is asked to create a Constraint Status object, it creates a PropDelayCnsStatus object. The algorithm that asks for the CnsStatus object does not need to know what type of constraint it is processing. Every Constraint Definition object knows how to produce its own constraint status CnsStatus object.

Critical to the success of abstract constraints is an abstract way of making decisions based on constraints without understanding the constraints themselves. That is, the constraint status CnsStatus objects can be used to determine whether or not a particular constraint is currently met or not met. Note however, CnsStatus objects do not know how to modify the design to meet their constraint. This job is performed by the "Handler" classes, described herein.

It's easy to compare two objects for the same constraint. For example, in SCR, a "compare" function is used to compare the status of two different probes. However, it can only make comparisons for a particular constraint, for example delay to determine which may be better. When several different constraints are involved, such as delay and crosstalk, it is often difficult, if not impossible, to determine that one object is better than another object.

There are a number of ways to make comparisons when multiple constraints are involved. A type of comparison that is of interest in evaluating multiple constraints is a vector comparison. In a vector comparison, the values for all of the relevant constraints are treated like a vector. For example, object "A" is "less" than object "B" if and only if one of the constraint values for "A" is less than its corresponding value in "B" and no constraint values for "A" are larger than their corresponding value in "B".

For example, the SCR routing engine uses vector comparisons to determine when to prune a probe. If an existing breadcrumb A is "less than" the new probe B, then there is no reason to continue expanding probe B.

3) Detail Handler Hierarchy

The Constraint Detail Handler Hierarchy (DetailHandler) is implemented inside the Detail component of the object oriented autorouter. That is, their header files and their source code files are local to the Detail subdirectories.

Figure 25:
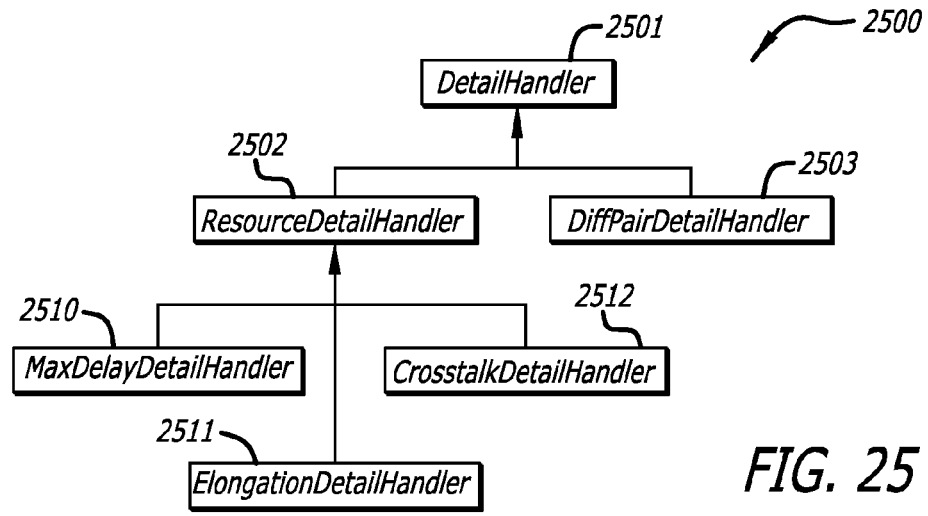
FIG. 25 is a simple exemplary Constraint Detail Handler Hierarchy.

FIG. 25 illustrates a simple exemplary Constraint Detail Handler Hierarchy 2500. It is to be understood that the actual hierarchy may be larger with many more classes parallel to that shown in FIG. 23C.

The exemplary Constraint Detail Handler Hierarchy 2500 includes a resource detail handler ResourceDetailHandler 2502 and a differential pair detail handler DiffPairDetailHandler 2503 at an intermediate base class. The resource detail handler ResourceDetailHandler 2502 has a sub-hierarchy including concrete subclasses of maximum delay detail handler MaxDelayDetailHandler 2510, elongation detail handler 2511, and cross-talk detail handler 2512.

Each Constraint knows that it has an associated Constraint Detail Handler and defines a factory method for creating its handler objects. However, neither the Constraint Definition nor the Constraint Status know anything about the Handlers other than their existence. In order words, the "createDetailHander" factory method is declared as a pure virtual function in the base constraint BaseCns. A virtual override for the same function is declared but not implemented in the available Constraint Definition header file for each constraint. However, these override functions are implemented in source files local to the Detail component.

Each Detail Handler knows how to invoke geometric Actions to improve compliance for its constraint. For example, the MaxDelayDetailHandler 2510 class could use length reducing actions, like a "Slide Segment" action, to reduce the length of its routed path. However, these actions might cause other design rules to be broken. It is the responsibility of each action to either (i) repair any design rule violation that it causes and return indicating success or (ii) do nothing and return indicating failure. Note that the Actions do not know what Objective invoked them or why. Actions only deal with the low-level geometric functions required to accomplish their task.

In some cases of detail handlers, such as NetMaxViaDetailHandler associated with a NetMaxViaCns 2315, there is nothing the geometric resolution engine (detail routing engine 213) can accomplish to improve compliance for its constraint. In these cases, the Detail Handler object 223 would do nothing and return results indicating failure. Instead, an Intent algorithm or some other high level algorithm can invoke one or more path selection algorithms to find a new path with fewer vias.

Detail Handler objects 223 are always transient in nature. They are created by an Intent when that Intent detects a CnsStatus object 224 that is out of compliance and requests its BaseCns object 2301 to create the appropriate DetailHandler object 223. The DetailHandler objects 223 are destroyed as soon as their objective is met or it is determined that their objective could not be met.

Since CnsDetail objects 224 all behave the same, the Intent algorithms can sort them according to user-specified priorities. For example, a user may specify that the manufacturing rules have top priority and the crosstalk rules are lowest priority. In this example, the Intent first creates and runs the Detail Handler objects for the manufacturing rules, then for the Delay rules, and finally for the crosstalk rules.

4) Topo Handler Hierarchy

In a topological representation of a design, exact locations have less meaning, allowing a more fluid approach to determining paths. With a topological routing engine 212, an additional hierarchy, referred to as a TOPO Constraint Handler hierarchy, is used to manage constraints topologically.

The TOPO Constraint Handler hierarchy (TopoHandler) is very similar to the geometric or detail constraint handler hierarchy, except that the actions that are invoked by the TOPO constraint handlers 222 are topological actions and not geometric actions.

Figure 26:
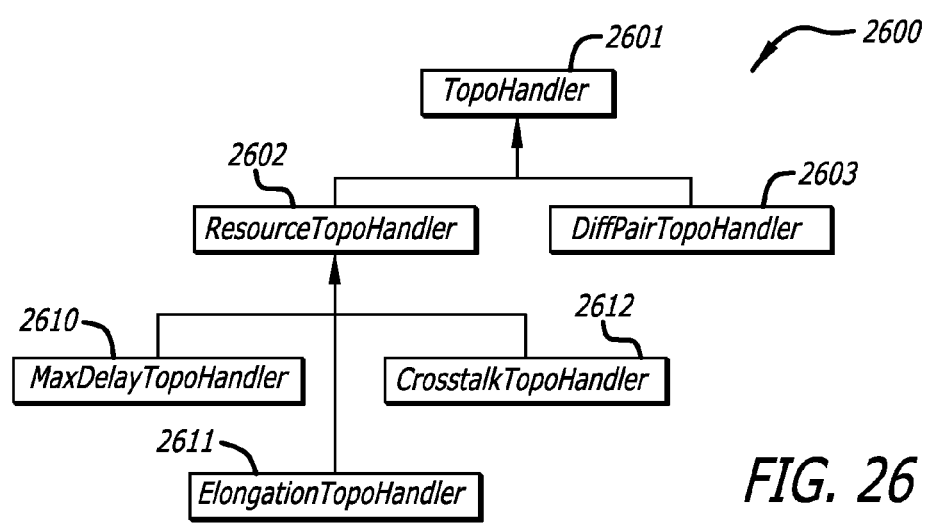
FIG. 26 is an exemplary TOPO Constraint Handler Hierarchy.

FIG. 26 illustrates an exemplary TOPO Constraint Handler Hierarchy 2600. It is to be understood that the actual hierarchy may be larger with many more classes parallel to that shown in FIG. 23C.

The exemplary TOPO Constraint Handler Hierarchy 2600 includes a resource topographical handler ResourceTopoHandler 2602 and a differential pair topographical handler DiffPairTopoHandler 2603 at an intermediate base class. The resource topographical handler ResourceTopoHandler 2602 has a sub-hierarchy including concrete subclasses of maximum delay topographical handler MaxDelayTopoHandler 2610, elongation topographical handler ElongationTopoHandler 2611, and cross-talk topographical handler CrosstalkTopoHandler 2612.

The topological handler objects have behavior very similar to the equivalent geometric or detailed handler objects. For example, MaxDelayTopoHandler objects 2610 know how to invoke actions that would reduce the length of their routing paths. It can invoke a "jump" action algorithm to move its path to the opposite side of a terminal and thus reduce its length. As with the geometric or detail handler classes, in some cases, such as a PinPairMaxViaTopoHandler, the objective will always fail, since there may be no topological transformation that can reduce the number of vias.

5) SCR Handler Hierarchy

In cases when neither the topological routing engine nor the geometric detail routing engine can meet all constraints, new paths may be selected to meet the constraints. The single connection router (SCR) engine 211 in the object oriented autorouter selects new paths to try and meet all the constraints.

The geometric or detail routing engine 213 and the topological routing engine 212 take an existing routing plan and transform it using any of several actions. In contrast, the SCR routing engine 211 finds a new path or replaces one path with a better one. There is a solution search space but it is performed by a series of "expansions" from one geometric or topological location to another. The expansions can be done in any order. The SCR engine may use recursive search algorithms or costed-wavefront type algorithms to perform the expansions or any of the many well known path search algorithms known in the industry.

Once a complete set of expansions is found reaching from a source terminal to a destination terminal (or destination terminal to source terminal), the SCR engine creates and installs the corresponding path (into the topological plan or geometric solution).

The single connection router (SCR) Handler Hierarchy (ScrHandler) is parallel to the other hierarchies but is slightly different in its functionality.

Figure 27:
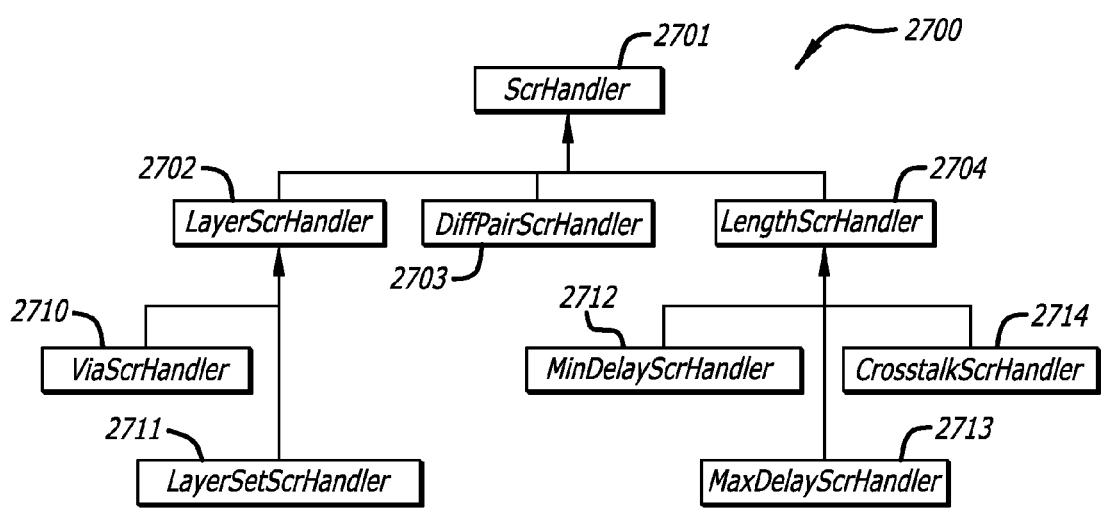
FIG. 27 is an exemplary SCR Handler Hierarchy.

FIG. 27 illustrates an exemplary SCR Handler Hierarchy 2700. It is to be understood that the actual hierarchy may be larger with many more classes parallel to that shown in FIG. 23C. The exemplary SCR handler Hierarchy 2700 includes a layer SCR handler LayerScrHandler 2702, a differential pair SCR handler DiffPairScrHandler 2703, and a length SCR Handler LengthScrHandler 2703 at an intermediate base class. The LayerScrHandler 2702 has a sub-hierarchy including concrete subclasses of via SCR handler ViaScrHandler 2710 and layer set SCR handler LayerSetScrHandler 2711. The length SCR handler LengthScrHandler 2704 has a sub-hierarchy including concrete subclasses of minimum delay SCR handler MinDelayScrHandler 2712, maximum delay SCR handler MaxDelayScrHandler 2713, and cross-talk SCR handler 2714.

The SCR Handler objects 221 can be used during each expansion to adjust the behavior of the expansions. In most cases, the SCR Handlers may simply adjust the cost functions to find a new path or select a better path. However, the capability exists for these Handler objectives to perform any expansion actions that are available.

Further, the SCR Handler objects can hold "state". For example, a crosstalk SCR handler can keep track of the total accumulated crosstalk of all expansions leading to a particular expansion. This additional information can be used to adjust the costs, to reject an expansion, or to split a single expansion into two or more expansions.

Thus, while the SCR Handlers may still be cost-based, the object oriented autorouter allows them to be independent from one another and provide additional options without incurring any performance degradation for constraints that are known but not used.

6) Interface Architecture

Typically, the details of each constraint class (definitions, status and handlers) is hidden from the routing engines and from the rest of the object oriented autorouter. Publicly available base classes are available throughout the object oriented autorouter.

However in some cases, the routing engines will be made aware of some of the details of some of the constraint handlers. For example, the SCR routing engine is made aware that some constraints are affected by distance. This information is made available to the SCR routing engine through an intermediate base class (in this case LengthCnsHandler). Thus, the SCR routing engine is aware of the common traits of length-related constraints without any knowledge of the specific constraints that are length-related.

7) File Organization

The file organization for code and objects are illustrated in FIGS. 29A-29C. The source code for a routing engine may be placed in one directory while the objects are placed in another directory. For example, the Topo routing engine code is placed in the Topo source code directory while the Topo headers are in the Topo local source include directory. Only a top-level include file is visible outside of the Topo source code directory.

This file organization isolates vendor source code from client source code. For example, a software vendor can distribute the header files and the object files and need not distribute the source code.

As illustrated in FIG. 29A, the base classes for each of the constraint hierarchies are in global include files.

As illustrated in FIG. 29B, the base classes are implemented in the subsystem that supports their view, but for SCR handlers. As the SCR Handlers may not need access to any SCR structures they can be organized with the constraint (CNS) tier of the RDM.

Referring now to FIG. 29C, an illustration of the Organization of Concrete Class Definitions is provided. Concrete classes for the definition and status hierarchies are declared in the CNS tier of RDM. Concrete classes for the constraint handler hierarchies are declared locally in the subsystem that supports their view. Where possible, the class definition is hidden inside the source file and may not be available to any other classes. Some of these classes may be made globally available.

This implies that the factories to create these classes are implemented in the source file for the constraint handler class they are creating not the source file that implements their constraint definition class. For example, consider PinPairDelayCns::createTopoHandler that is defined in a constraint definition file (pinpairdelaycns.h) but implemented in a topo handler file (pinpairdelaytopohandler. cxx).

Intermediate classes (base classes which are derived from the root base class) are declared in as locally as possible. For Definition and Status hierarchies, these must be global. For the other hierarchies, these classes are defined in their local include directories.

This organization minimizes changes to existing code and provides maximum isolation for algorithms. That is, the entire system is aware that the hierarchies exist (the base classes) and is aware of the basic functionality of each of the hierarchies (the virtual functions). But, only the individual subsystems (CNS, SCR, TOPO, and DETAIL) are aware of the specific constraint handlers and their implementations.

Exemplary Operation

Referring now to FIGS. 28A-28E, an exemplary operation of the detail geometric routing engine 213 is illustrated.

Figure 28A:
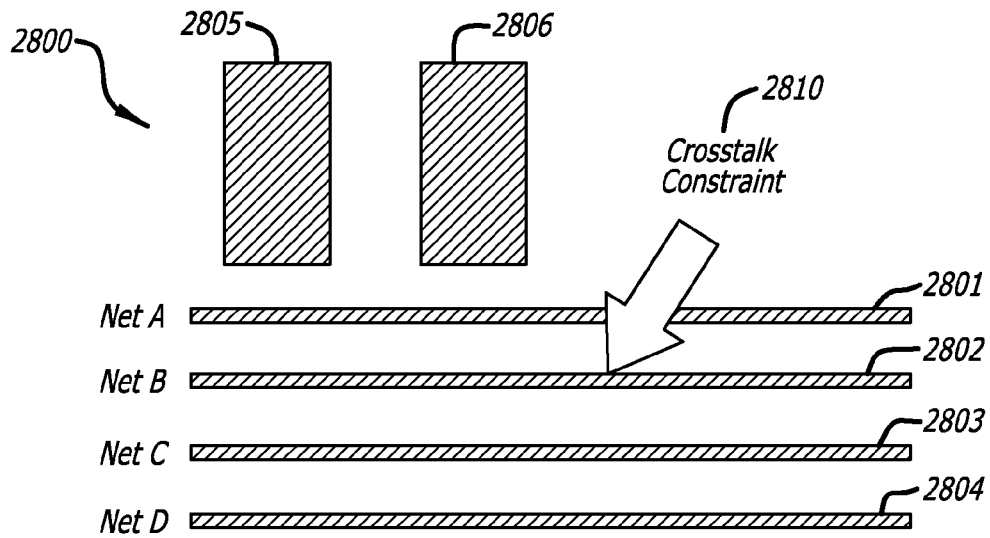
FIGS. 28A-28E illustrate exemplary routing operation of the detail geometric routing engine on a simple circuit.

In FIG. 28A, a circuit 2800 with nets 2801-2804 and pins 2805-2806 is illustrated. Assume that the circuit 2800 has failed to meet a crosstalk constraint on net B 2802 with net A 2801 and net C 2803 being aggressors to generate crosstalk in net B 2802. The pins 2805-2806 to north of net B 2802 limit movement of the nets in a north direction. The detail routing engine 213 adjusts such shapes to meet a crosstalk constraint 2810 of net B 2802.

Figure 28B:
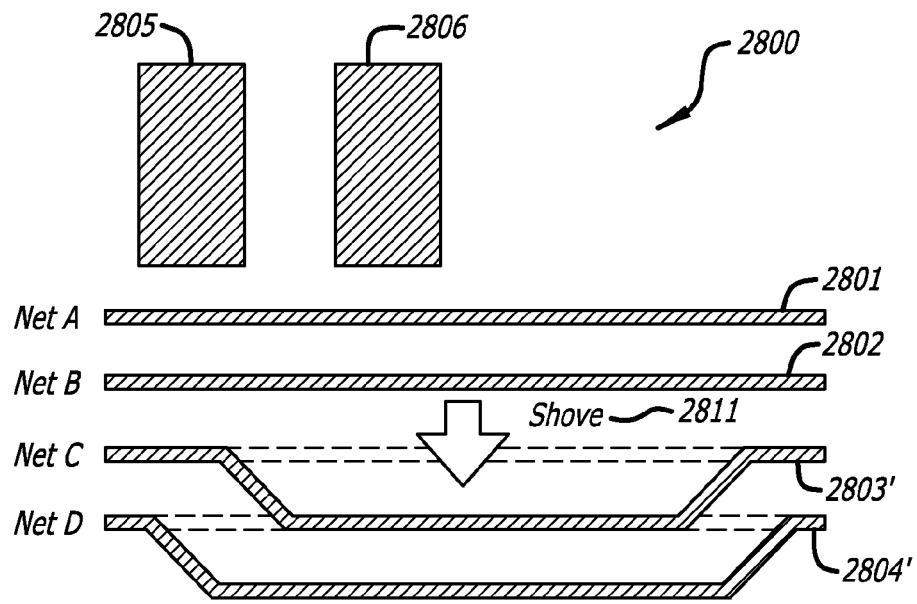

Referring to FIG. 28B, the detail routing engine 213 first gets the status of the crosstalk on Net B 2802 and determines that it is too high. The detail routing engine 213 then creates a DetailHandler 223 for the crosstalk constraint 2810. The DetailHandler 223 determines that Net C 2803 is an aggressor. The DetailHandler 223 then attempts to increase the clearance rule between Net B 2802 and Net C 2803. This causes the detail routing engine 213 to shove Net C 2803 and Net D 2804 away from net B 2802 in a southern direction as illustrated by arrow 2811 in FIG. 28B to positions illustrated by net C 2803' and net D 2804'.

Figure 28C:
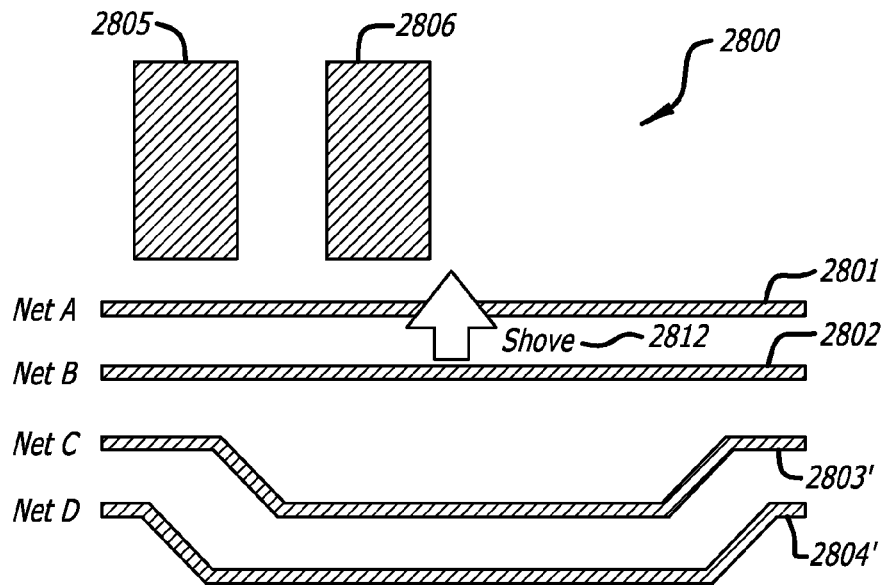

Next referring to FIG. 28C, the DetailHandler 223 determines that Net A 2801 is also an aggressor. The DetailHandler 223 then attempts to increase the clearance rule between Net B 2802 and Net A 2801. This causes the detail routing engine 213 to attempt to shove Net A 2801 to the North away from net B 2802 as illustrated by arrow 2812 in FIG. 28C.

Figure 28D:
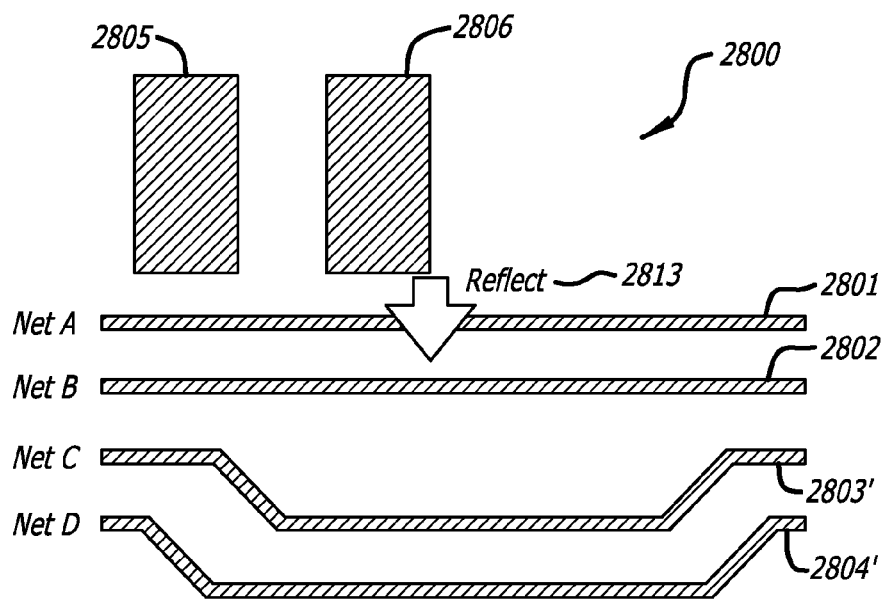

Referring to FIG. 28D, there is not enough space between net A 2801 and the pins 2805-2806 to the north. As a result, the shoved net A 2801 reflects off the pins 2805-2806 as illustrated by arrow 2813 in FIG. 28D.

Figure 28E:
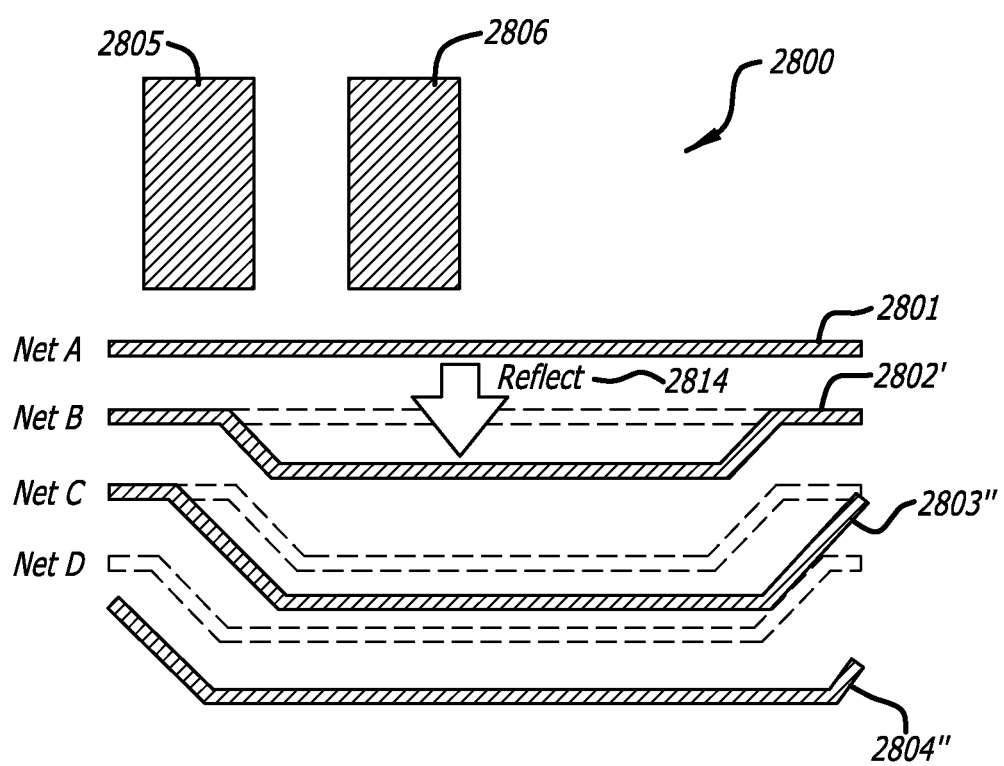

In FIG. 28E, the detail routing engine 213 shoves net B 2802, net C 2803', net D 2804' to the south away from Net A 2801 as illustrated by arrow 2814 in FIG. 28E in response to the reflection. Net B 2802, net C 2803', and net D 2804' are respectively shoved to positions of net B 2802', net C 2803", and net D 2804" as illustrated in FIG. 28E to eliminate the cross-talk violation.

Adaptability

The routing requirements of circuits will change and new object oriented constraints can be readily generated to meet these changes. The architectural design of the objected oriented autorouter can readily adapt to support these new constraints when they are generated.

Computing System

Referring now to FIG. 30, a computing system 3100 is illustrated that may be used to perform some or all of the processes in accordance with a number of embodiments of the invention. In one embodiment of the invention, the computing system 3100 includes a processor 3110, a memory 3120, a removable media drive 3130, a hard disk drive 3140, and a network interface 3150. In one embodiment, the processor 3110 executes instructions residing on a machine-readable medium, such as the hard disk drive 3140, a removable medium 3101 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 3120, which may include Random Access Memory (RAM), dynamic RAM (DRAM), etc. The processor 3110 may retrieve the instructions from the memory 3120 and execute the instructions to perform the operations described above.

Note that any or all of the components and the associated hardware illustrated in FIG. 30 may be used in various embodiments of the system 3100. However, it should be appreciated that other configurations of the system 3100 may include more or less devices than those shown in FIG. 30.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below.

Additionally, the embodiments of the invention are not described with reference to any particular programming language. It will be appreciated that a variety of programming languages may be used to implement the teachings of the invention as described herein.

When implemented in software, the elements of the embodiments of the invention are essentially the code segments to perform the necessary tasks. The program or code segments can be stored in a processor readable or machine-readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, acoustical or other form of propagated signals (e.g., carrier waves, infrared signals, digital signals, etc.). The code segments may be downloaded via computer networks such as the Internet, Intranet, etc.

CONCLUSION

The embodiments of the invention are thus described. One advantage of the embodiments of the invention is that information about how to meet a particular constraint is defined in its Objectives not spread throughout the system. The algorithms for one constraint do not need to know about the specifics of any other constraint. The algorithms for Intents and Actions do not need to know the specifics of particular constraints. Constraints can be processed in an abstract way.

Another advantage of the embodiments of the invention is that new constraints can be added without extensive changes to existing constraints. Furthermore, new constraints can be added externally by customers to implement their own constraint rules.

Another advantage of the embodiments of the invention is the ability for customers to define their own proprietary constraints. Because the interface between "Objectives" and "Actions" is well defined and independent of the specific features of the constraints, it is possible to define an Application Program Interface (API) for an Objective. External developers can add new constraints to the system. These additions can remain their proprietary property. The autorouter product can support these additional customer-defined constraints without implementing them directly in the product. This can be done without exposing the routing algorithms to the customer or exposing the constraint details to the autorouter vendor.

Another advantage of the embodiments of the invention is the additional flexibility in an autorouter is possible by abstracting the concept of a constraint. An Intent can sort constraints by some criteria of its own, it can then apply the constraint Objectives is a particular order to meet its own goals. An Intent can easily enable/disable particular categories of constraints without any knowledge of the specifics of those constraints. This provides considerable additional routing performance capabilities.

Because all constraints are essentially equivalent, the user could externally affect the sort order used to resolve constraints. Thus, in an overly constrained system, the router would be able to know which constraints to relax first.

Constraint Objectives are not used unless the constraint is currently enabled. Therefore, constraints rules that are known to the system but not active take zero time to process. This is an important performance advantage for a system with hundreds of different constraint rules.

Until a particular constraint is known to be (or expected to be) out of compliance, the Intent algorithms can often ignore that constraint. For example, during early routing passes, all constraints can be ignored. When a constraint is found that it not met, that constraint can be activated for future passes. This can be a significant performance boost for a design with many constraints that are easy to meet.

In summary, this invention improves the ability of an autorouter to find solutions to designs with a large number of competing constraints. And, it provides a simplified growth path for supporting new constraints that did not exist when the original algorithms were written.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Rather, the embodiments of the invention should be construed according to the claims that follow below.

What is claimed is:

1. A system for routing nets in a circuit, the system comprising:
    a processor to execute instructions; and
    instructions stored in a storage device that when executed by the processor perform operations including
        reading constraint definitions of a plurality of constraints to which the nets of the circuit are to comply;
        generating at least one constraint handler in response to the constraint definitions, the at least one constraint handler to invoke a routing action associated with a routing engine to route a net; and
        performing the routing action to improve compliance of the net with the plurality of constraints.

2. The system of claim 1, wherein
    one of the plurality of constraints is a custom constraint that is dynamically linked to an object oriented autorouter during run time.

3. The system of claim 1, wherein
    one of the plurality of constraints is a custom constraint that is plugged into an object oriented autorouter during run time.

4. The system of claim 1, wherein
the routing engine is one or more of a single connection routing engine, a topographical transformation routing engine, and a detail geometric routing engine.

5. The system of claim 1, wherein
the constraints are objects and an object oriented autorouter routes the nets of the circuit.

6. The system of claim 1, wherein
the routing engine is a detail routing engine, and
the routing action is one or more of a shove segment action, a shove terminal action, a jump ratline over terminal action, and a neckdown ratline action to modify a geometric shape.

7. The system of claim 1, wherein
the routing engine is a topo routing engine, and
the routing action is one or more of a shove joint action, a jump ratline over joint action, an unwind ratline action, and a neckdown ratline action to modify a topological graph.

8. The system of claim 1, wherein
the routing engine is a single connection routing engine, and
the routing action is one or more of an increase cost action and a split probe action to find a routing path between terminals.

9. A system for routing nets in a circuit, the system comprising:
a processor to execute instructions; and
instructions stored in a storage device that when executed by the processor perform operations including
providing a plurality of actions in at least one routing engine to route nets in a circuit, wherein the plurality of actions are low level routing algorithms that route the nets in the circuit;
determining which ones of the plurality of actions to invoke to route the nets in the circuit in response to a plurality of objectives, the plurality of objectives are mid-level routing algorithms included as part of a plurality of design constraints; and
determining which of the plurality of objectives to apply to route the nets in the circuit in response to at least one design intent, wherein the at least one design intent is a high level routing algorithm.

10. The system of claim 9, wherein
if one or more design constraints are not satisfied, then the processor, in response to at least one design intent, further to perform the operation of relaxing one or more design constraints of the plurality of design constraints to reroute the nets of the circuit.

11. The system of claim 9, wherein
if one or more design constraints are all satisfied, then the processor, in response to at least one design intent, further to perform the operation of strengthening one or more design constraints to reroute the nets of the circuit.

12. The system of claim 9, wherein
the at least one design intent is to find a global topological routing solution meeting all electrical constraints while ignoring one or more physical constraints.

13. The system of claim 9, wherein
the at least one design intent is to adjust at least one design constraint to increase physical clearance rules to improve manufacturability of the circuit; and
if a routing solution for the circuit cannot be found using the at least one adjusted design constraint, then the processor, in response to the at least one design intent, further to perform the operation of returning the at least one adjusted design constraint to its prior value.

14. The system of claim 9, wherein
the determining which of the plurality of objectives to apply to route the nets in the circuit includes the processor performing the operations of
assigning relative priorities to the plurality of design constraints; and
sorting the relative priorities of the plurality of design constraints to determine a sequential order to apply the plurality of design constraints in routing the nets of the circuit.

15. The system of claim 14, wherein
the relative priorities of the plurality of design constraints are user specified priorities.

* * * * *